(12) United States Patent
Yu et al.

(10) Patent No.: US 8,772,173 B2
(45) Date of Patent: Jul. 8, 2014

(54) METHOD OF MANUFACTURING SEMICONDUCTOR DEVICE

(75) Inventors: Hyun-kwan Yu, Suwon-si (KR); Dong-suk Shin, Yongin-si (KR); Pan-kwi Park, Incheon (KR); Ki-eun Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 114 days.

(21) Appl. No.: 13/461,088

(22) Filed: May 1, 2012

(65) Prior Publication Data

US 2012/0315760 A1 Dec. 13, 2012

(30) Foreign Application Priority Data

Jun. 9, 2011 (KR) ........................ 10-2011-0055742

(51) Int. Cl.
*H01L 21/302* (2006.01)
*H01L 21/461* (2006.01)

(52) U.S. Cl.
USPC ............. 438/740; 438/50; 438/197; 438/680;
257/E21.006; 257/E21.077; 257/E21.126;
257/E21.134; 257/E21.135; 257/E21.17;
257/E21.267; 257/E21.278; 257/E21.292;
257/E21.293; 257/E21.329; 257/E21.311;
257/E21.347; 257/E21.421

(58) Field of Classification Search
USPC ........... 438/740, 197, 680, 50, 206, 240, 257,
438/266, 600, 789, 744, 755, 757, 675, 756,
438/743, 509, 514; 257/E21.006, E21.077,
257/E21.126, E21.134, E21.135, E21.17,
257/E21.267, E21.278, E21.293, E21.292,
257/E21.329, E21.331, E21.347, E21.421
See application file for complete search history.

(56) References Cited

U.S. PATENT DOCUMENTS 7,550,396 B2 * 6/2009 Frohberg et al. ............. 438/757
7,816,271 B2 * 10/2010 Lee et al. ...................... 438/702
7,871,941 B2 * 1/2011 Frohberg et al. ............. 438/783

FOREIGN PATENT DOCUMENTS

| JP | 2009-111067 | 5/2009 |
|---|---|---|
| JP | 2009-277909 | 11/2009 |
| KR | 10-2007-0050341 A | 5/2007 |

* cited by examiner

*Primary Examiner* — David Nhu
(74) *Attorney, Agent, or Firm* — Lee & Morse, P.C.

(57) ABSTRACT

A method of manufacturing a semiconductor device includes providing a substrate having a gate structure, a source region, and a drain region formed thereon, and the gate structure includes a gate insulating layer and a gate electrode. The method also includes forming a first stress layer on the substrate, removing the first stress layer, and forming a second stress layer on the substrate.

18 Claims, 23 Drawing Sheets

CHANNEL REGION

METHOD OF MANUFACTURING SEMICONDUCTOR DEVICE

CROSS-REFERENCE TO RELATED APPLICATION

Korean Patent Application No. 10-2011-0055742, filed on Jun. 9, 2011, in the Korean Intellectual Property Office, and entitled: "Method of Manufacturing Semiconductor Device," is incorporated by reference herein in its entirety.

BACKGROUND

As a part of industrial and multimedia development, semiconductor devices used in computers, mobile equipment, and the like are designed to be highly integrated and to have high performance. In line with the increase in the integration density of semiconductor devices, the parameters of design rules required for components of the semiconductor devices has been reduced.

SUMMARY

Embodiments may be realized by providing a method of manufacturing a semiconductor device includes providing a substrate having a gate structure, a source region, and a drain region formed thereon such that the gate structure includes a gate insulating layer and a gate electrode, forming a first stress layer on the substrate, removing the first stress layer, and forming a second stress layer on the substrate.

Both the first stress layer and the second stress layer may provide a same type of stress from among a compressive stress and a tensile stress such that the first and second stress layers exert the same type of stress on a channel region. The channel region may be between the source region and the drain region of the substrate.

Prior to forming the second stress layer, the method may include forming of the first stress layer and removing of the first stress layer may be performed a plurality of times. Removing the first stress layer may include removing a portion of the first stress layer such that another portion of first stress layer remaining on the substrate has a predetermined thickness.

Prior to forming the first stress layer and prior to forming the second stress layer, the method may include forming a buffer layer including a material having etch selectivity with respect to each of the first stress layer and the second stress layer. The first stress layer and the second stress layer may both include a silicon nitride.

Forming the first stress layer and forming the second stress layer may both include depositing the silicon nitride, and irradiating ultra violet rays to the silicon nitride. Depositing the silicon nitride for forming the first stress layer and depositing the silicon nitride for forming the second stress layer may include performing ion bombardment on the silicon nitride.

The gate insulating layer may include a material with a high dielectric constant, and the gate electrode may include a metal. Prior to forming the first stress layer, the method may include forming a metal silicide layer on the gate electrode, the source region, and the drain region.

Forming the metal silicide layer may include forming a metal layer on the gate structure, the source region, and the drain region, heat-treating the metal layer to selectively form the metal silicide layer on the gate structure, the source region, and the drain region, and removing non-reacted portions of the metal layer. The non-reacted portions of the metal layer may correspond to portions of the metal layer excluded from the metal silicide layer.

The method may include forming an interlayer insulating layer on the substrate, and forming contact plugs on the source region and the drain region by using the second stress layer as an etch stop layer. When a stress exerted on a channel region between the source region and the drain region is a tensile stress, the tensile stress is equal to or greater than about 1.5 GPa.

Embodiments may also be realized by providing a method of manufacturing a semiconductor device that includes providing a substrate having a gate electrode, a source region, and a drain region formed thereon, forming an etch stop layer for forming contact plugs that are connected to the source region and the drain region, respectively, on the substrate, removing at least a portion of the etch stop layer, and forming an additional etch stop layer on the substrate.

The etch stop layer and the additional etch stop layer may contain a stress therein.

Embodiments may also be realized by providing a method of manufacturing a semiconductor device that includes providing a substrate having a gate structure, a source region, and a drain region formed thereon such that the gate structure includes a gate insulating layer and a gate electrode, forming a first stress layer on the substrate, removing at least a portion of the first stress layer, forming a second stress layer on the substrate after removing at least the portion of the first stress layer, forming an interlayer insulating layer on the second stress layer, and forming contact holes in the interlayer insulating layer by using the second stress layer as an etch stop layer.

The substrate may include a channel region between the source region and the drain region, and the first stress layer and the second stress layer may apply a same type of stress to the channel region. The first stress layer may be formed to cover the gate structure, the source region, and the drain region. Removing the first stress layer may include removing substantially an entirety of the first stress layer such that the second stress layer covers the gate structure, the source region, and the drain region.

When the portion of the first stress layer is removed, another portion of the first stress layer may remain on the gate structure, the source region, and the drain region. The second stress layer may be formed on the other portion of the first stress layer that remains on the gate structure, the source region, and the drain region.

The method may include forming a third stress layer and a fourth stress layer before forming the interlayer insulating layer. The gate structure, the source region, and the drain region may be one of a plurality of gate structures, a plurality of source regions, and a plurality of drain regions, respectively. The substrate may include a NMOS region and a PMOS region each having formed therein at least one of the plurality of gate structures, at least one of the plurality of source regions, and at least one of the plurality of drain regions. The first stress layer and the second stress layer may apply a first type of stress to one channel region in one of the NMOS region and the PMOS region. The third stress layer and the fourth stress layer apply a second type of stress to another channel region in another of the NMOS region and the PMOS region, the second type of stress being different from the first type of stress.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
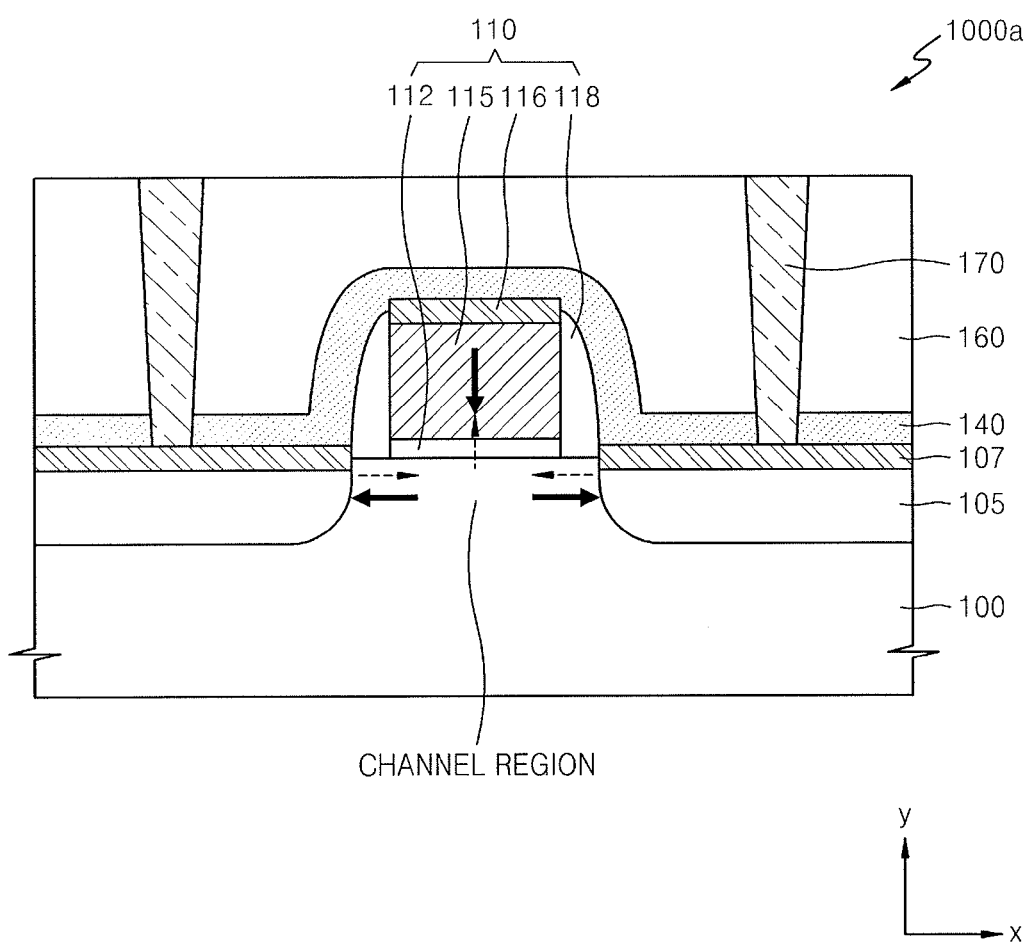
FIG. 1 illustrates a cross-sectional view of a semiconductor device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Like reference numerals refer to like elements throughout. In the drawing figures, the dimensions of layers and regions may be exaggerated for clarity of illustration. Variations from the shapes of the illustrations as a result, e.g., of manufacturing techniques and/or tolerances may be expected. Thus, embodiments should not be construed as limited to the particular shapes of regions illustrated herein but are to include deviations in shapes that result, e.g., from manufacturing. In addition, various elements and regions may be schematically shown in the drawing figures. Thus, embodiments are not limited to relative sizes and intervals shown in drawing figures. As used herein, the term "and/or" includes any and all combinations of one or more of the associated listed items.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

FIG. 1 illustrates a cross-sectional view of a semiconductor device 1000a according to an exemplary embodiment.

Referring to FIG. 1, the semiconductor device 1000a may include a gate structure 110 formed on a substrate 100. A second stress layer 140 may be formed to cover the gate structure 110 and may be formed at two opposing sides of the gate structure 110. Contact plugs 170 may be formed on source and drain regions 105 (hereinafter, referred to as the source/drain regions 105) and may be foamed at two opposing sides of the gate structure 110. The contact plugs 170 may extend through the second stress layer 140. The semiconductor device 1000a may constitute a logic device or a memory device.

The substrate 100 may include a semiconductor material, e.g., a Group IV semiconductor, a Group III to V compound semiconductor, or a Group II to VI oxide semiconductor. The substrate 100 may be, e.g., a silicon monocrystalline substrate or an epitaxial layer. The substrate 100 may include a well region (not shown) formed by implanting impurities.

The substrate 100 may include the source/drain regions 105 that are disposed at two opposing sides of the gate structure 110. The source/drain regions 105 may be formed to have a predetermined depth within the substrate 100 in an active region, and may be defined by an impurity region including impurities. The impurities may be n-type impurities, e.g., phosphorus (P), arsenic (As), and/or antimony (Sb). In addition, the impurities may be p-type impurities, e.g., boron (B), aluminum (Al), and/or gallium (Ga). A metal silicide region 107 may be formed on the source/drain regions 105.

The gate structure 110 may include a gate insulating layer 112, a gate electrode 115, a gate silicide layer 116, and a spacer 118. The gate insulating layer 112 may include, e.g., a material with a high dielectric constant (k). The gate electrode 115 may include, e.g., a metal and/or polysilicon. A metal silicide layer 116 may be formed on, e.g., directly on an uppermost surface of, the gate electrode 115. The spacer 118 may be disposed on lateral sides of the gate insulating layer 112 and lateral sides of the gate electrode 115. The spacer 118 may also be formed on at least a portion of lateral sides of the gate silicide layer 116. The spacer 118 may include, e.g., one layer or multi-layers including a silicon nitride and/or a silicon oxide.

The second stress layer 140 may be formed so as to cover an upper portion of the gate structure 110, e.g., to cover the gate silicide layer 116, and to cover upper portions of the metal silicide region 107 on the source/drain regions 105. The second stress layer 140 may include, e.g., a silicon nitride. For example, the second stress layer 140 may include any one of or at least one of SiCN, $Si_3N_4$, SiON, and SiBN. The second stress layer 140 may have a thickness in the range of about 200 Å to about 700 Å.

As described below with reference to FIGS. 2A through 2G, the second stress layer 140 together with a first stress layer 130 (refer to FIG. 2D) may be formed on the source/drain regions 105, e.g., in order to exert a stress on a channel region formed in the substrate 100 between the source/drain regions 105. The channel region may be a region within the substrate 100 that is under a central portion of the gate structure 110. Due to the stress, an energy band structure of the channel region may be changed, e.g., to increase charge mobility. For example, a tensile stress may increase charge mobility and a compressive stress may increase hole mobility. Thus, the second stress layer 140 may contain a stress therein. According to a type of the semiconductor device 1000a, the stress may be a tensile stress or a compressive stress.

As indicated by solid arrows in FIG. 1, according to an exemplary embodiment, the second stress layer 140 may exert a stress on the gate structure 110 towards the substrate 100 in a y-axis direction so that a tensile stress may be exerted on the channel region in an x-axis direction towards both of the source/drain regions 105. In this case, the tensile stress exerted on the channel region may be equal to or greater than about 1.5 GPa. Alternatively, as indicated by dotted arrows in FIG. 1, the second stress layer 140 may exert a stress on the gate structure 110 in the y-axis direction towards an opposite direction of the substrate 100 so that a compressive stress may be exerted on the channel region in the x-axis direction towards the channel region relative to both of the source/drain regions 105. In this case, the compressive stress may be equal to or greater than about 3.2 GPa.

The contact plugs 170 may be formed on the source/drain regions 105. The contact plugs 170 may expose the metal silicide region 107 on the source/drain regions 105 so as to be in direct contact therewith, e.g., the contact plugs 107 may not extend through the metal silicide region 107. The contact plugs 170 may be disposed to apply voltages to the source/drain regions 105, e.g., in order to operate the semiconductor device 1000a. The contact plugs 170 may be formed to be connected to the metal silicide region 107 through an interlayer insulating layer 160, which covers the second stress layer 140. A wiring line (not shown) may be connected to upper portions of the contact plugs 170. The gate structure 110 may also be connected to the wiring line through a separate conductive member having a plug type shape that is, e.g., on a region that is not shown in FIG. 1.

In the semiconductor device 1000a, the second stress layer 140 may exert a stress on the channel region so as to, e.g., increase charge mobility of the semiconductor device 1000a, thereby increasing a drain current of the semiconductor device 1000a.

FIGS. 2A through 2G illustrate cross-sectional views depicting stages in a method of manufacturing the semiconductor device 1000a of FIG. 1, according to an exemplary embodiment.

Figure 2A:
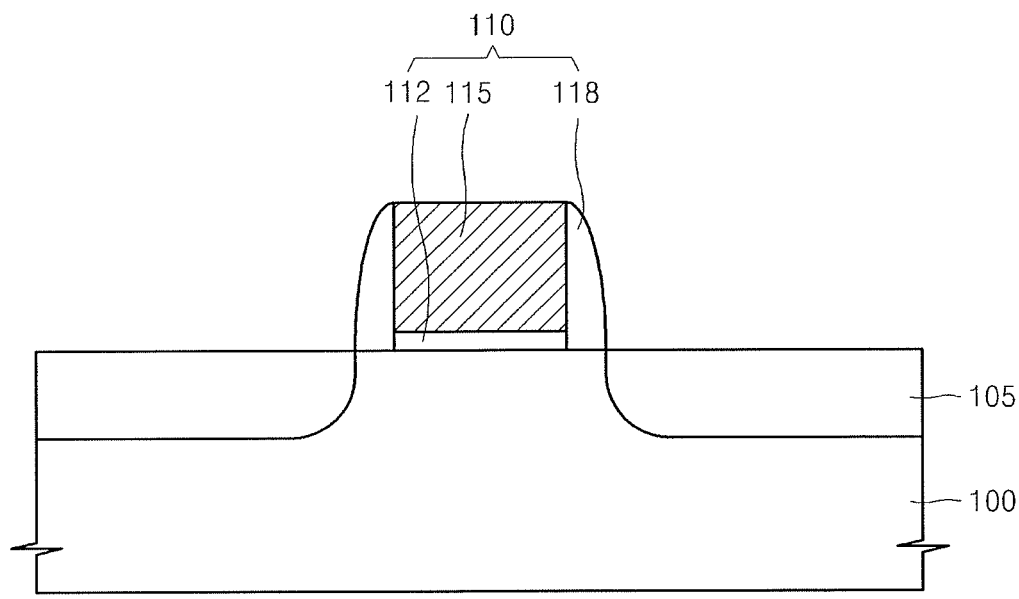
FIGS. 2A through 2G illustrate cross-sectional views depicting stages in a method of manufacturing the semiconductor device of FIG. 1, according to an exemplary embodiment.

Referring to FIG. 2A, the gate structure 110 may be formed on the substrate 100. The gate structure 110 may be formed by sequentially depositing a material for forming the gate insulating layer 112 and a material for forming the gate electrode 115 and patterning the materials to form a stacked structure, e.g., lateral sides of the stacked structure may be vertically aligned. The gate insulating layer 112 may include a dielectric material with a high-k or a composite layer including, e.g., a silicon oxide ($SiO_2$) and a silicon nitride (SiN). In this case, the dielectric material with a high-k refers to a dielectric material having a higher dielectric constant than that of silicon oxide ($SiO_2$). The dielectric material with a high-k may include at least one selected from an aluminium oxide ($Al_2O_3$), a tantalium oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminium oxide ($LaAl_xO_y$), a lanthanum hafnium oxide ($LaHf_xO_y$), a hafnium aluminium oxide ($HfAl_xO_y$), and a praseodymium oxide ($Pr_2O_3$).

The gate electrode 115 may include a single layer or a composite layer, including at least one selected from poly silicon, aluminium (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), and nitrides thereof. For example, the gate electrode 115 may include a composite layer including a metal material and a polysilicon.

Then, the spacer 118 may be formed on a lateral surface of the gate insulating layer 112 and a lateral surface of the gate electrode 115. The spacer 118 may include an insulating material, e.g., a silicon nitride. The spacer 118 may be formed by depositing an insulating material and performing an etch-back process so as to expose an upper portion of the gate structure 110 and an upper portion of the substrate 100 that surrounds the sides of the gate structure 110.

Then, the source/drain regions 105 may be formed by implanting impurities into the substrate 100 by using the gate structure 110 as a mask. The source/drain regions 105 may be aligned with ends of the spacer 118. The impurities may be implanted by implanting ions at a predetermined angle.

Figure 2B:
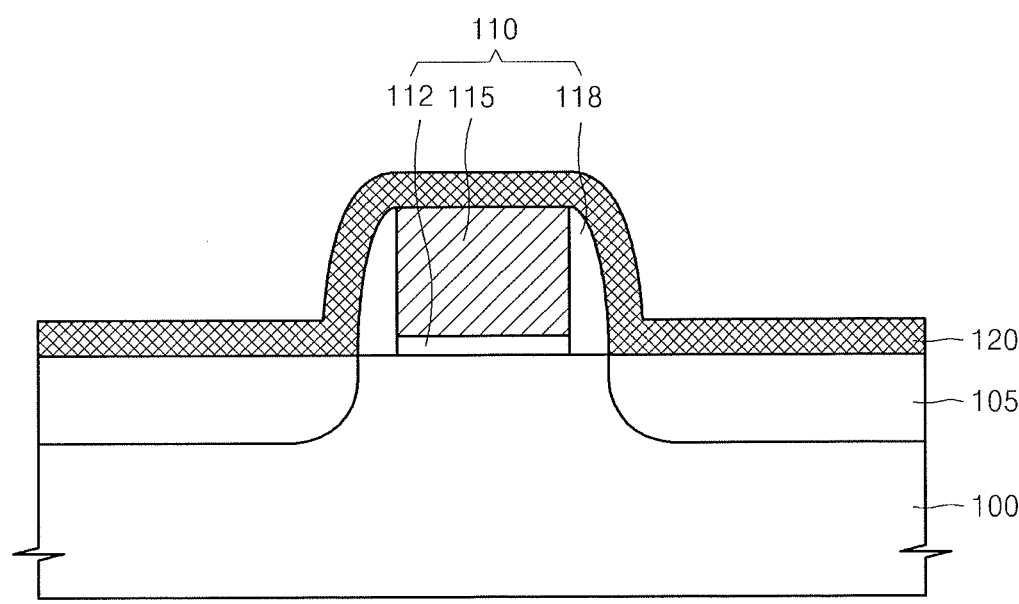

Referring to FIG. 2B, a metal layer 120 may be formed on the gate structure 110 and the source/drain regions 105. The metal layer may cover, e.g., completely cover, an uppermost surface and lateral sides of the gate structure 110, and may cover, e.g., completely cover, the source/drain regions 105. The metal layer 120 may include any one of titanium (Ti), cobalt (Co), platinum (Pt), and nickel (Ni). The metal layer 120 may have a thickness, e.g., in the range of about 100 Å to about 400 Å. The range for the thickness of the metal layer 120 is not limited thereto, e.g., the range may be about 150 Å to about 350 Å, about 200 Å to about 300 Å, about 250 Å to about 375 Å, etc.

Selectively, a capping layer (not shown) may be formed on the metal layer 120. The capping layer may, e.g., maintain the thermal stability of the gate structure 110 and may reduce the possibility of and/or prevent the metal layer 120 from being oxidized during a silicidation reaction of FIG. 2C.

Figure 2C:
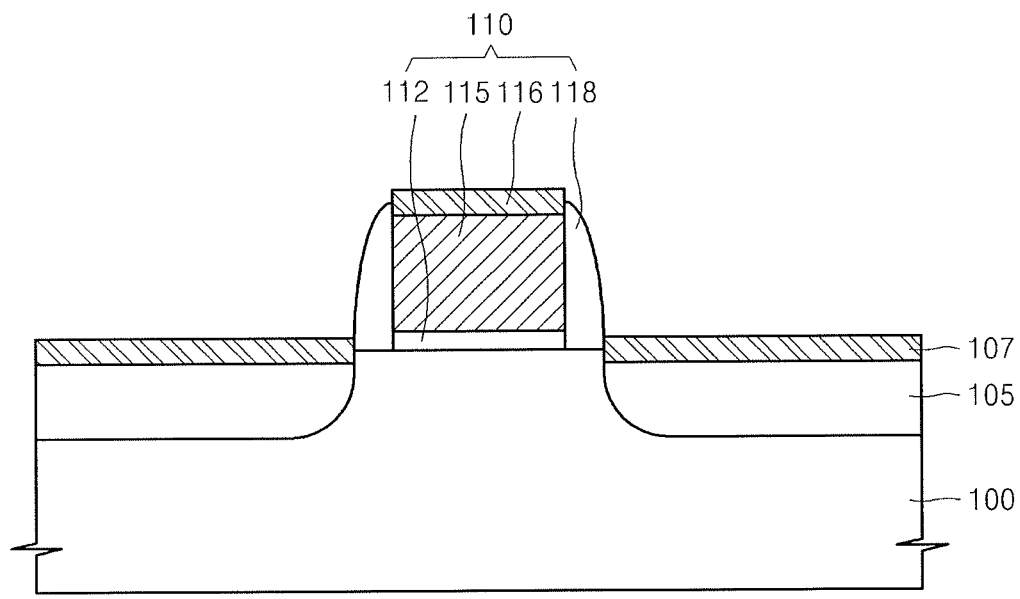

Referring to FIG. 2C, the metal silicide layer 116 and the metal silicide region 107 may be formed on the gate electrode 115, e.g., on the uppermost surface of the gate electrode 115, and the source/drain regions 105, respectively, by performing heat-treatment. The metal silicide layer 116 and the metal silicide region 107 may each have a thickness in the range of about 100 Å to about 300 Å. The metal silicide layer 116 may be a portion of the gate electrode 115, e.g., at least a portion of the metal silicide layer 116 may be embedded into an upper portion of the gate electrode 115, but for clarity the metal silicide layer 116 is separately referred to from the gate electrode 115. Both the metal silicide layer 116 and the gate electrode 115 may be included in the gate structure 110.

The metal silicide layer 116 and the metal silicide region 107 may each include a silicon compound, and at least one metal selected from titanium (Ti), cobalt (Co), nickel (Ni), platinum (Pt), and tantalum (Ta). According to a modified exemplary embodiment, when the gate electrode 115 does not include polysilicon, the metal silicide layer 116 may not be formed on the gate electrode 115.

The metal layer 120 may be subjected to at least one heat treatment during the formation of the metal silicide layer 116 and the metal silicide region 107. For example, when the metal layer 120 of FIG. 2B includes Ti or Co, the metal layer 120 may be primarily heat-treated at a temperature in the range of about 350° C. to about 600° C., and may be secondarily heat-treated at a temperature in the range of 500° C. to about 900° C. so as to form silicide layers with a stable phase. In this case, the primary heat treatment may be performed first and then the secondary heat treatment may be preformed at some time thereafter. When the metal layer 120 includes Ni or a Ni alloy, the metal layer 120 may be heat-treated at a temperature in the range of about 350° C. to about 600° C. just once so as to form silicide layers with a stable phase.

Then, portions of the metal layer 120 that are un-reacted may be removed by using an etching process. For example, a portion of the metal layer 120 that is formed on the spacer 118, e.g., on sidewalls of the spacer 118, and a portion of the metal layer 120 that is formed on a device isolation layer (not shown), may be removed. Accordingly, the metal layer 120 may be removed so that the metal silicide layer 116 and the metal silicide region 107 may remain. In this case, the above-described secondary heat-treatment using Ti or Co may be performed after the etching process.

Like in the current operation, the metal silicide layer 116 and the metal silicide region 107 that are formed without a photolithography process may each be referred to as self-aligned silicide, or self-aligned silicide in that the metal silicide layer 116 and the metal silicide region 107 each have a self-aligned structure. The metal silicide layer 116 and the metal silicide region 107 may reduce resistance of the gate electrode 115 and resistance of the source/drain regions 105, respectively.

Figure 2D:
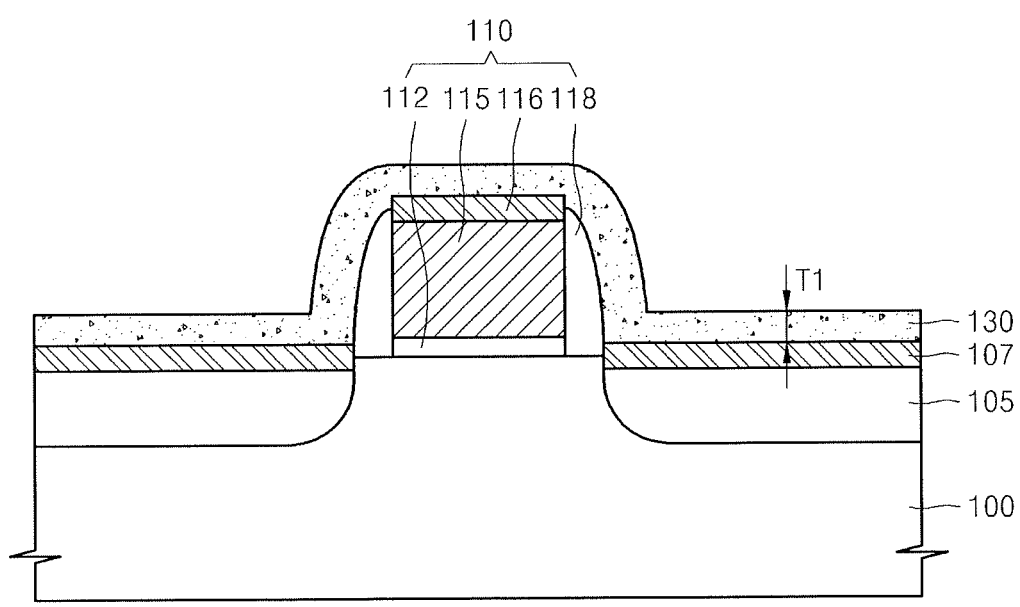

Referring to FIG. 2D, the first stress layer 130 may be formed on exposed surfaces of the gate structure 110, e.g., on the metal silicide layer 116 and sidewalls of the spacer 118, and the metal silicide region 107. The first stress layer 130 may be, e.g., a silicon nitride layer. The first stress layer 130 may be formed by chemical vapor deposition (CVD) such as plasma enhanced CVD (PECVD), rapid thermal CVD (RTCVD), or low pressure CVD (LPCVD).

The first stress layer 130 may have a first thickness T1, and the first thickness T1 may be in the range of about 200 Å to about 700 Å. The range for the first thickness T1 is not limited thereto, e.g., the range may be about 300 Å to about 600 Å, about 400 Å to about 500 Å, about 350 Å to about 650 Å, etc. According to a type of the semiconductor device 1000a, the first thickness T1 may vary. The first thickness T1 may be determined so that a tensile stress or a compressive stress may be exerted on components disposed below the first stress layer 130. The type and size of a stress of the first stress layer 130 may be determined according to a formation condition, e.g., ion bombardment, a deposition gas, a deposition pressure, and/or a deposition temperature, with respect to a deposition layer.

When the first stress layer 130 is a silicon nitride layer, it may be determined whether the first stress layer 130 exerts a tensile stress or a compressive stress according to a ratio of nitrogen (N)-hydrogen (H) bond and silicon (Si)-hydrogen (H) in the first stress layer 130. For example, when the number of N—H bonds divided by the number of Si—H bonds is equal to or smaller than about 5, the first stress layer 130 may exert a tensile stress. As such, if the number of N—H bonds is less than 5 times greater than the number of Si—H bonds, the resultant first stress layer 130 may provide a tensile stress, e.g., so as to cause an expansion/increase in volume. When the number of N—H bonds divided by that of Si—H bond is greater than about 5, the first stress layer 130 may exert a compressive stress. As such, if the number of N—H bonds is at least 5 times greater than the number of Si—H bonds, the resultant first stress layer 130 may provide a compressive stress, e.g., so as to cause a compression/decrease in volume.

Figure 2E:
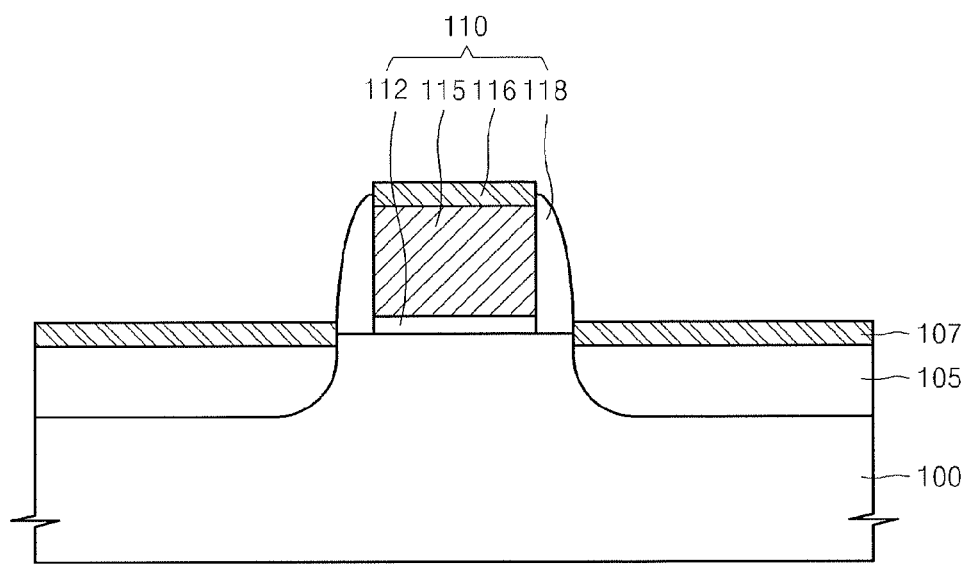

Referring to FIG. 2E, the first stress layer 130 may be removed. The first stress layer 130 may be removed by using, e.g., a wet etch process or a dry etch process. According to an exemplary embodiment, an entire portion of the first stress layer 130 may be removed. In exemplary embodiments, the stage of forming the first stress layer 130 and the stage of removing the first stress layer 130 may be performed a plurality of times. For example, the first stress layer 130 may be formed and removed, then another first stress layer 130 may be formed and removed, etc.

Even after the first stress layer 130 is removed, a stress exerted by the first stress layer 130 may remain in at least the channel region. For example, after the first stress layer 130 is formed and later removed, the effect of the stress may remain in the channel region without an additional process such as a heat-treatment process and/or a recrystallization process.

Figure 2F:
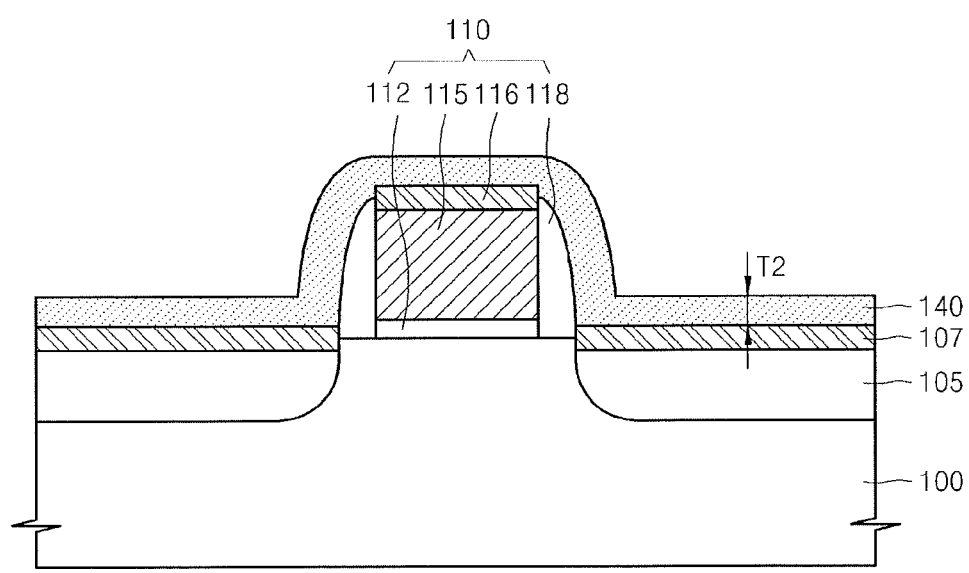

Referring to FIG. 2F, the second stress layer 140 may be formed on exposed surface of the gate structure 110, e.g., on the metal silicide layer 116 and sidewalls of the spacer 118, and the metal silicide region 107. In a subsequent process described with reference to FIG. 2G, the second stress layer 140 may serve as an etch stop layer during an etch process for forming the contact plugs 170. Accordingly, the second stress layer 140 may remain in the resultant semiconductor device.

The second stress layer 140 may be, e.g., a silicon nitride layer. The second stress layer 140 may have a same type of stress as the first stress layer 130 of FIG. 2D. That is, both the first stress layer 130 and the second stress layer 140 may exert a tensile stress on the channel region or may exert a compressive stress on the channel region.

The second stress layer 140 may have a second thickness T2. The second thickness T2 may be substantially equal to the first thickness T1 of the first stress layer 130 of FIG. 2D. Alternatively, the second thickness T2 may be different from the first thickness T1. According to a type of the semiconductor device 1000a, the second thickness T2 may be varied.

A stress may be sequentially exerted on the channel region of the semiconductor device 1000a at least twice by the first stress layer 130 and the second stress layer 140. In addition, the second stress layer 140 may not be removed, e.g., may remain in the resultant semiconductor device, and the second stress layer 140 may continually exert a stress on the channel region. Thus, a high stress may be exerted on the channel region, compared to a case where a single process for forming a stress layer is performed. For example, a stress equal to or greater than about 1.5 GPa may be exerted on the channel region. In addition, the above-described high stress may be exerted twice, thereby reducing the possibility of and/or preventing the metal silicide region 107 formed below the first and second stress layers 130 and 140 from being damaged. For example, the first and second stress layers 130 and 140 may reduce the possibility of and/or prevent the metal silicide region 107 from being agglomerated.

Figure 2G:
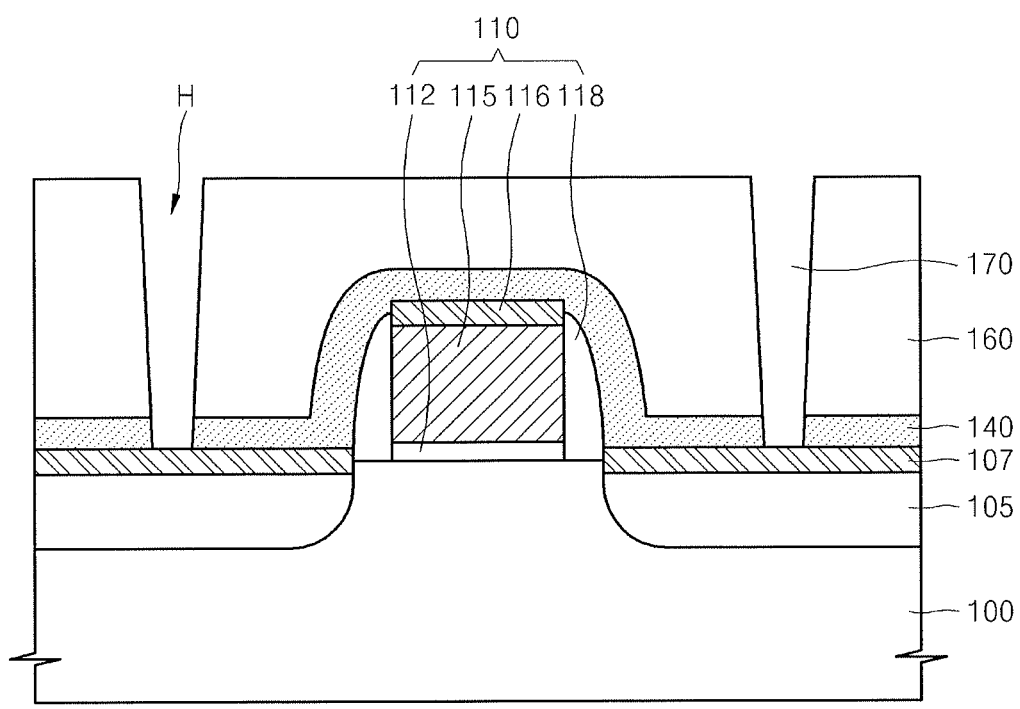

Referring to FIG. 2G, the interlayer insulating layer 160 may be formed on the substrate 100. The interlayer insulating layer 160 may cover the entire substrate 100, e.g., may cover the entire gate structure 110 and the entire source/drain regions 105. The interlayer insulating layer 160 may be formed on the gate structure 110 to have a predetermined height, e.g., a predetermined height that is greater than a height of the gate structure 110. The interlayer insulating layer 160 may include, e.g., a silicon oxide.

Then, contact holes H may be formed in the interlayer insulating layer 160, e.g., by partially etching the second stress layer 140 and the interlayer insulating layer 160 in a region overlapping the source/drain regions 105. The contact holes H may expose the metal silicide region 107 on the source/drain regions 105. The etching may be anisotropic etching, and the second stress layer 140 may serve as an etch stop layer for subsequent stages in the method of manufacturing a semiconductor device. For example, when the second stress layer 140 includes a silicon nitride, and the interlayer insulating layer 160 includes a silicon oxide, the second stress layer 140 has high etch selectivity with respect to the interlayer insulating layer 160. Thus, the etching for forming the contact holes H may include two operations in which the interlayer insulating layer 160 is first etched and the second stress layer 140 is second etched, i.e., in a separate etching operation, by using the second stress layer 140 as an etch stop layer.

The contact plugs 170 may be formed by depositing a conductive material in the contact holes H, thereby completing the manufacture of the semiconductor device 1000a illustrated in FIG. 1. According to the present exemplary embodiment, stress layers are formed twice during the manufacturing of a single semiconductor device, which is just an example. Alternatively, stress layers may be formed at least three times.

Figure 3A:
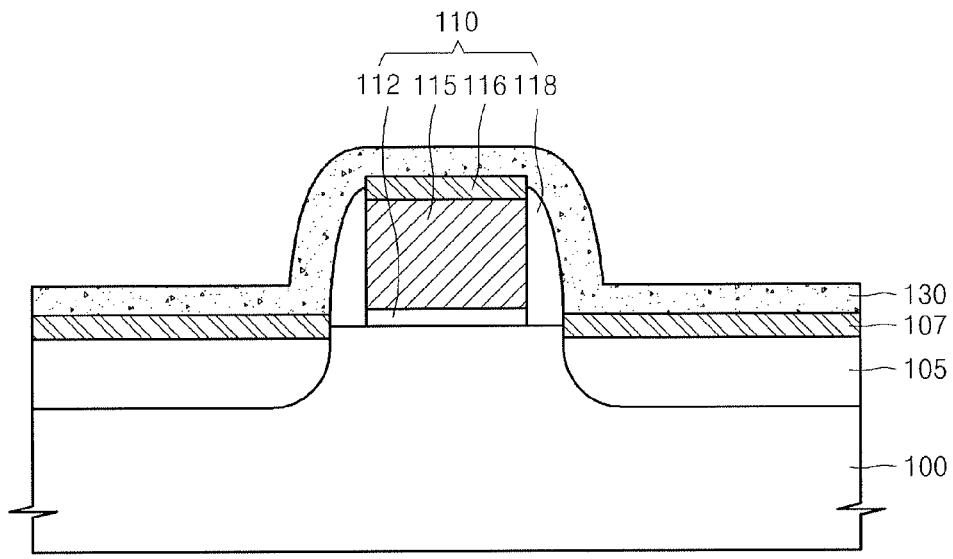
FIGS. 3A through 3C illustrate cross-sectional views depicting stages in a method of manufacturing a semiconductor device, according to an exemplary embodiment.
Figure 3B:
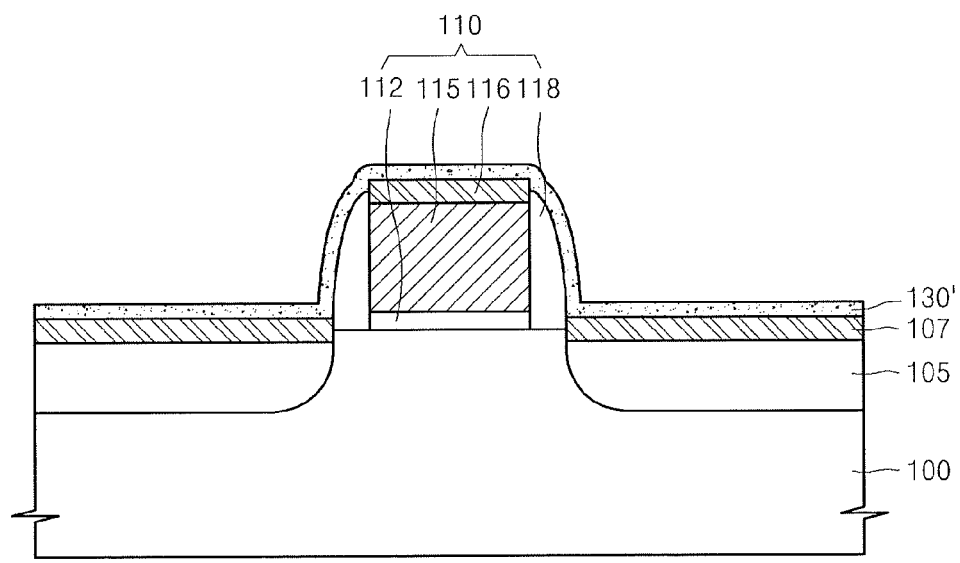
Figure 3C:
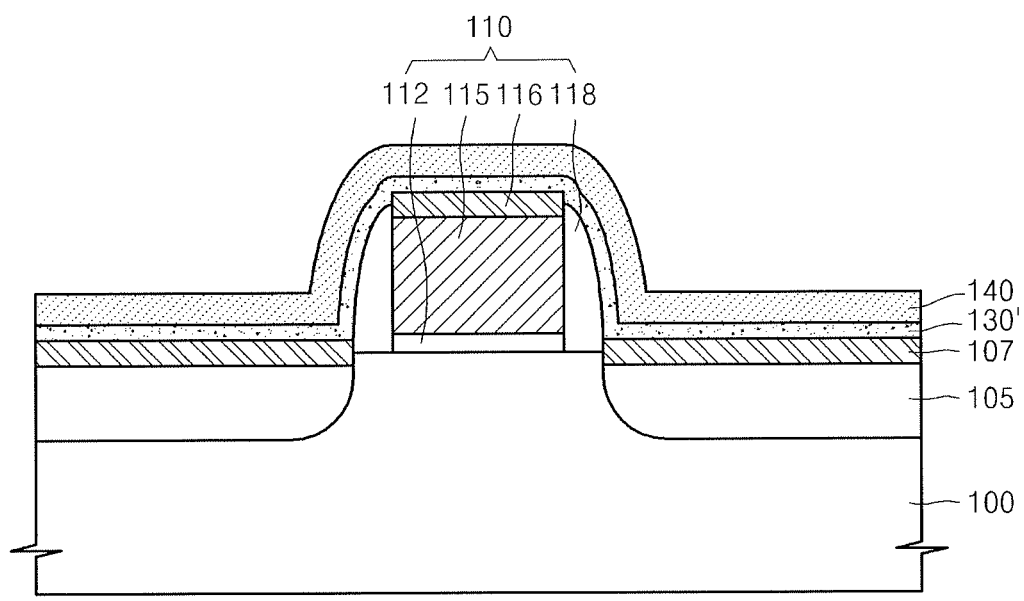

FIGS. 3A through 3C illustrate cross-sectional views depicting stages in a method of manufacturing a semiconductor device, according to another exemplary embodiment. The exemplary embodiment may be similar to the above exemplary embodiments, and differences between the above exemplary embodiments and following exemplary embodiment will be mainly discussed.

Referring to FIG. 3A, the same operations as the operations described with reference to FIGS. 2A through 2C may be performed. Then, the first stress layer 130 may be formed on the gate structure 110 and the metal silicide region 107. The first stress layer 130 may include, e.g., a silicon nitride.

According to the exemplary embodiment, the first stress layer 130 may be a silicon nitride layer formed by implanting nitrogen (N) into a silicon oxide layer. According to another modified exemplary embodiment, the first stress layer 130 may be formed by implanting impurities such as argon (Ar) or germanium (Ge) into a silicon nitride layer. The impurities such as Ar or Ge may adjust an amount of compressive stress of the first stress layer 130.

Referring to FIG. 3B, a portion of the first stress layer 130 may first be removed, e.g., such that a thickness of the first stress layer 130 is reduced. For example, the thickness of the first stress layer 130 may be reduced by about one half to about one fifth. The portion of the first stress layer 130 may be removed by using a wet etch process or a dry etch process. According to the present embodiment, a first stress layer 130' remains after removing the portion of the first stress layer 130. For example, an upper portion of the entire first stress layer 130 may be removed to leave only the lower portion that forms the first stress layer 130'. The first stress layer 130' may not be relatively thick so that a stress of the second stress layer 140 may be sufficiently exerted on the channel region, in FIG. 3C.

Referring to FIG. 3C, the second stress layer 140 may be formed on the first stress layer 130'. The second stress layer 140 may be, e.g., a silicon nitride layer. The second stress layer 140 may be a silicon nitride layer formed by CVD. Alternatively, the second stress layer 140 may be formed by forming a silicon oxide layer and implanting nitrogen (N) into the silicon oxide layer, e.g., similar to the first stress layer 130.

A stress may be sequentially exerted twice on the channel region, which may be within the substrate 100 and under the gate structure 110, of the semiconductor device. The stress, according to the present exemplary embodiment, may be provided by both the first stress layer 130 and the second stress layer 140. Thus, a high stress may be exerted on the channel region, compared to a case where a single process for forming a stress layer is performed. For example, a tensile stress equal to or greater than about 1.5 GPa or a compressive stress equal to or greater than about 3.2 GPa may be exerted on the channel region.

Figure 4:
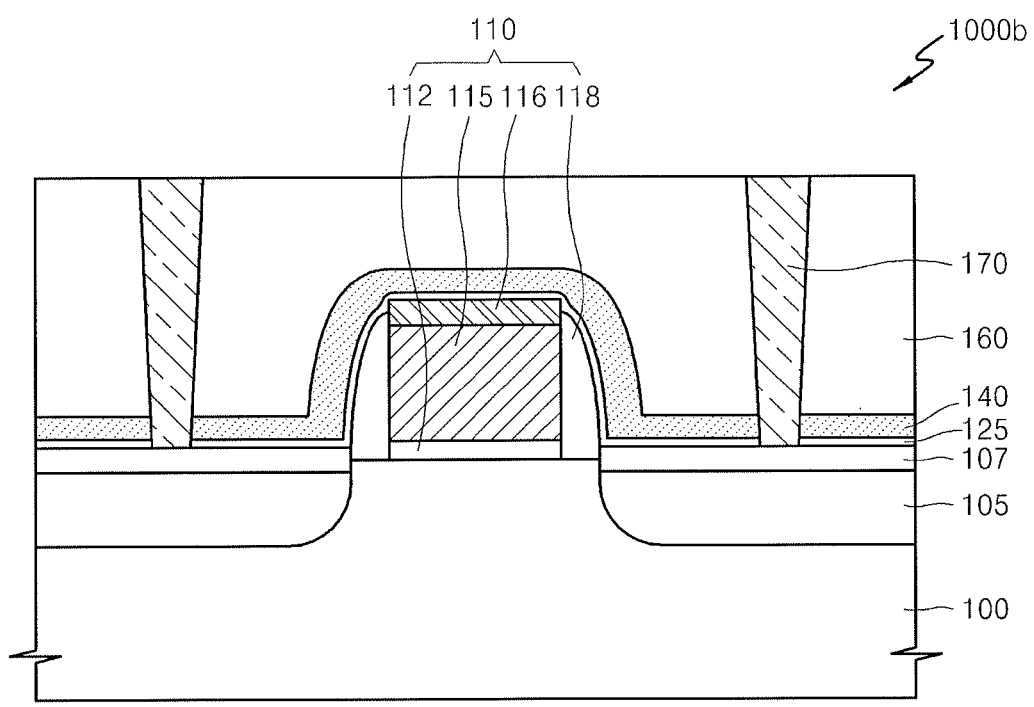
FIG. 4 illustrates a cross-sectional view of a semiconductor device, according to an exemplary embodiment.

FIG. 4 illustrates a cross-sectional view of a semiconductor device 1000b according to another exemplary embodiment. Hereinafter, the same reference numerals as in FIG. 1 denote the same components as in FIG. 1, and thus their detailed description will be omitted here. The exemplary embodiment may be similar to the above exemplary embodiments, and differences between the above exemplary embodiments and the following exemplary embodiment will be mainly discussed.

Referring to FIG. 4, the semiconductor device 1000b may include the gate structure 110 formed on the substrate 100, a buffer layer 125, the second stress layer 140, and the contact plugs 170 formed on source/drain regions 105 formed at two opposing sides of the gate structure 110.

The buffer layer 125 may include, e.g., a silicon oxide. The buffer layer 125 may be formed to have a relatively small thickness, e.g., in the range of about 50 Å to about 100 Å. The buffer layer 125 may serve as an etch stop layer when the first stress layer 130 is formed, e.g., during a subsequent stage described below with reference to FIG. 5C. The buffer layer 125 may, e.g., serve as a protective layer. The buffer layer 125 may be a continuous layer that covers the gate structure 110, the sidewalls thereof, and the source/drain regions 105.

The second stress layer 140 may be formed so as to cover an upper portion, e.g., upper surface, of the buffer layer 125 on the gate structure 110 and the source/drain regions 105. The second stress layer 140 may include, for example, silicon nitride. The second stress layer 140 may have a thickness in the range of about 200 Å to about 700 Å.

As described below with reference to FIGS. 5A through 5D, the second stress layer 140 together with the first stress layer 130 (refer to FIG. 5B) may be formed on the source/drain regions 105 in order to exert a stress on a channel region formed in the substrate 100 between the source/drain regions 105. Due to the stress, an energy band structure of the channel region may be changed to increase charge mobility. Thus, the second stress layer 140 may contain a stress therein. According to a type of the semiconductor device 1000b, the stress may be a tensile stress or a compressive stress.

The second stress layer 140 may exert a tensile stress on the channel region. Alternatively, a compressive stress may be exerted by the second stress layer 140 on the channel region.

In the semiconductor device 1000b, the second stress layer 140 may exert a stress on the channel region, thereby increasing charge mobility of the semiconductor device 1000b, and thus, e.g., increasing the drain current and improving characteristics of the semiconductor device 1000b.

FIGS. 5A through 5D illustrate cross-sectional views depicting stages in a method of manufacturing the semiconductor device 1000b of FIG. 4, according to another exemplary embodiment.

Figure 5A:
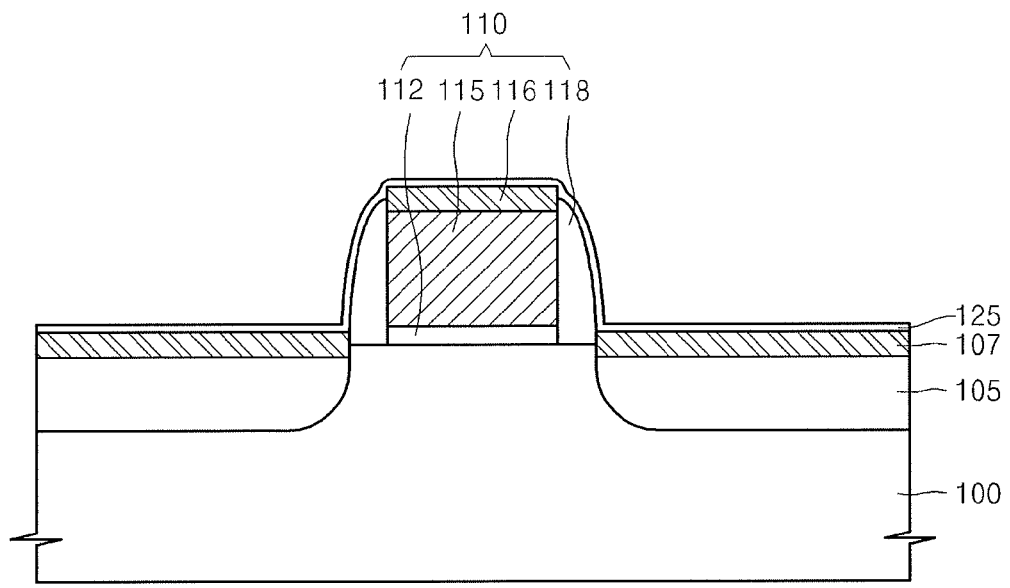
FIGS. 5A through 5D illustrate cross-sectional views depicting stages in a method of manufacturing the semiconductor device of FIG. 4, according to an exemplary embodiment.

Referring to FIG. 5A, the same operations as the operations described with reference to FIGS. 2A through 2C may be performed. Then, the buffer layer 125 may be formed on an exposed surface of the gate structure 110 and the metal silicide region 107. The buffer layer 125 may be formed by CVD or PVD. The buffer layer 125 may serve as an etch stop layer and/or a protective layer. For example, when the buffer layer 125 is used as an etch stop layer, when the first stress layer 130 is removed in FIG. 5C, the buffer layer 125 may reduce the possibility of and/or prevent the spacer 118 from being etched. The buffer layer 125 may facilitate determination of a point of time when etching is finished. When the buffer layer 125 is used as a protective layer, the buffer layer 125 may protect the metal silicide region 107 and the metal silicide layer 116 from being damaged during process stages.

Figure 5B:
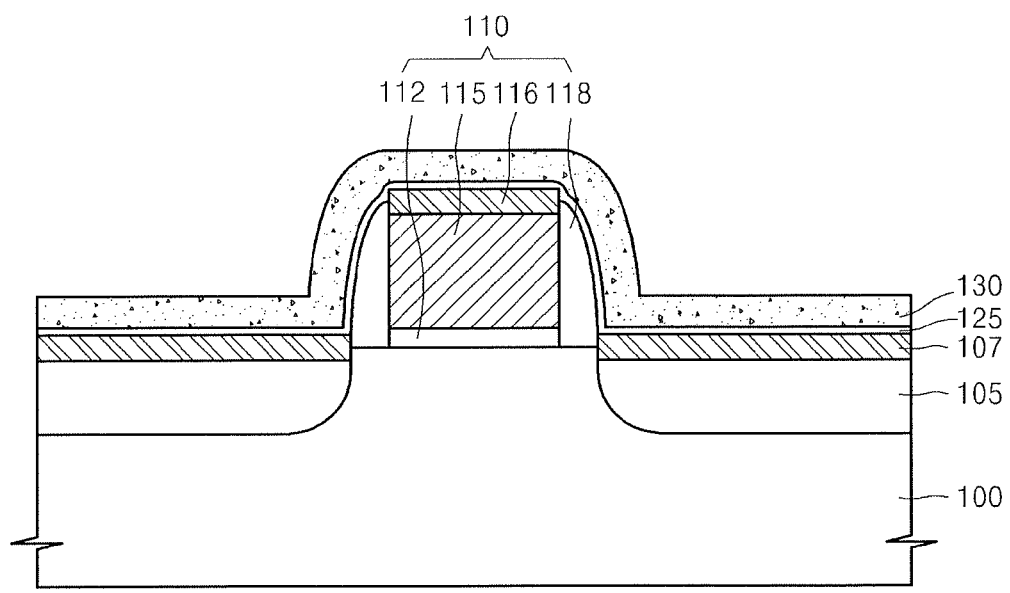

Referring to FIG. 5B, the first stress layer 130 may be formed on the buffer layer 125. The first stress layer 130 may be, e.g., a silicon nitride layer. The first stress layer 130 may be formed by CVD to have a thickness in the range of about 200 Å to about 700 Å.

Figure 5C:
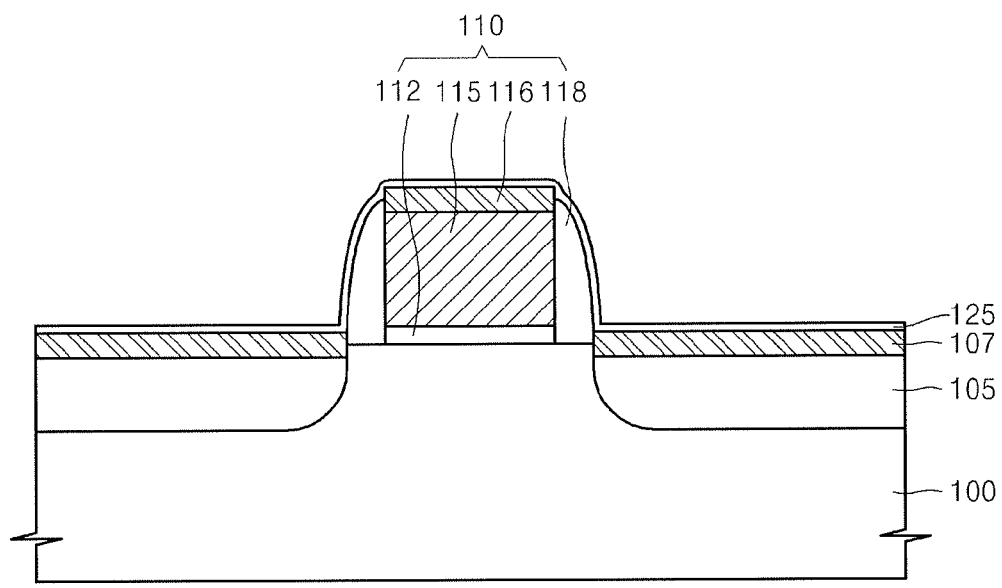

Referring to FIG. 5C, the first stress layer 130 may be removed. The first stress layer 130 may be removed by using a wet etch process or a dry etch process. According to an exemplary embodiment, an entire portion of the first stress layer 130 may be removed. Even after the entire portion of the first stress layer 130 is removed, a stress exerted by the first stress layer 130 may remain in the channel region. Accordingly to an exemplary embodiment, a plurality of first stress layers 130 may be formed and each of the plurality of first stress layers 130 may be subsequently removed.

Figure 5D:
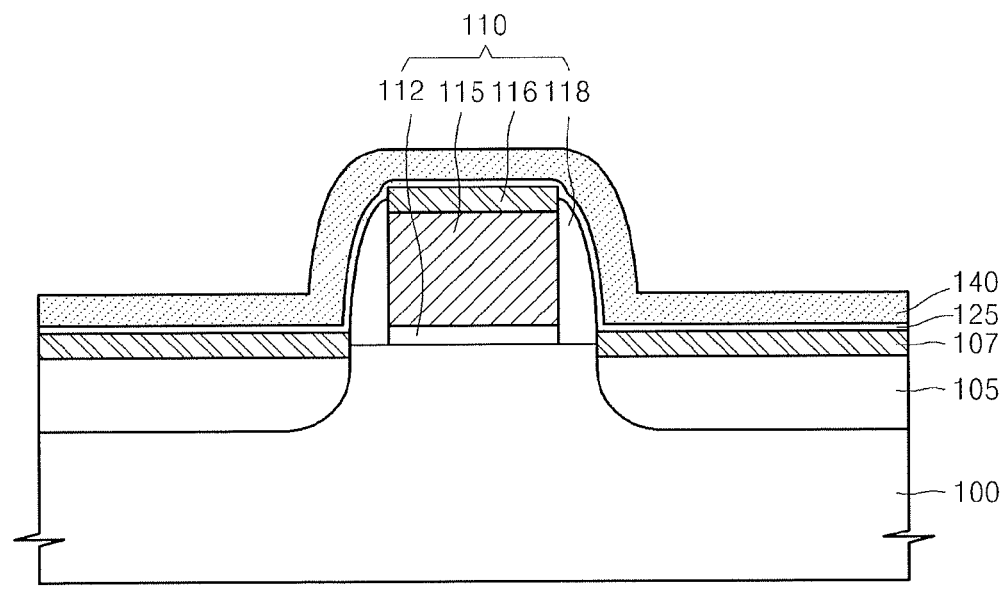

Referring to FIG. 5D, the second stress layer 140 may be formed on the buffer layer 125. The second stress layer 140 may be, e.g., a silicon nitride layer. The second stress layer 140 may be formed by CVD. The second stress layer 140 may have substantially the same or similar thickness as the first stress layer 130, and may exert the same type of stress on the channel region.

A stress may be sequentially exerted on the channel region of the semiconductor device 1000b at least twice, e.g., by the first stress layer 130 and the second stress layer 140. Thus, a high stress may be exerted on the channel region, compared to a case where a single process for forming a stress layer is performed. The above-described high stress may be exerted twice such that the possibility of the metal silicide region 107 formed below the first and second stress layers 130 and 140 being damaged may be reduced and/or prevented. For example, the metal silicide region 107 may be prevented from being agglomerated.

Figure 6:
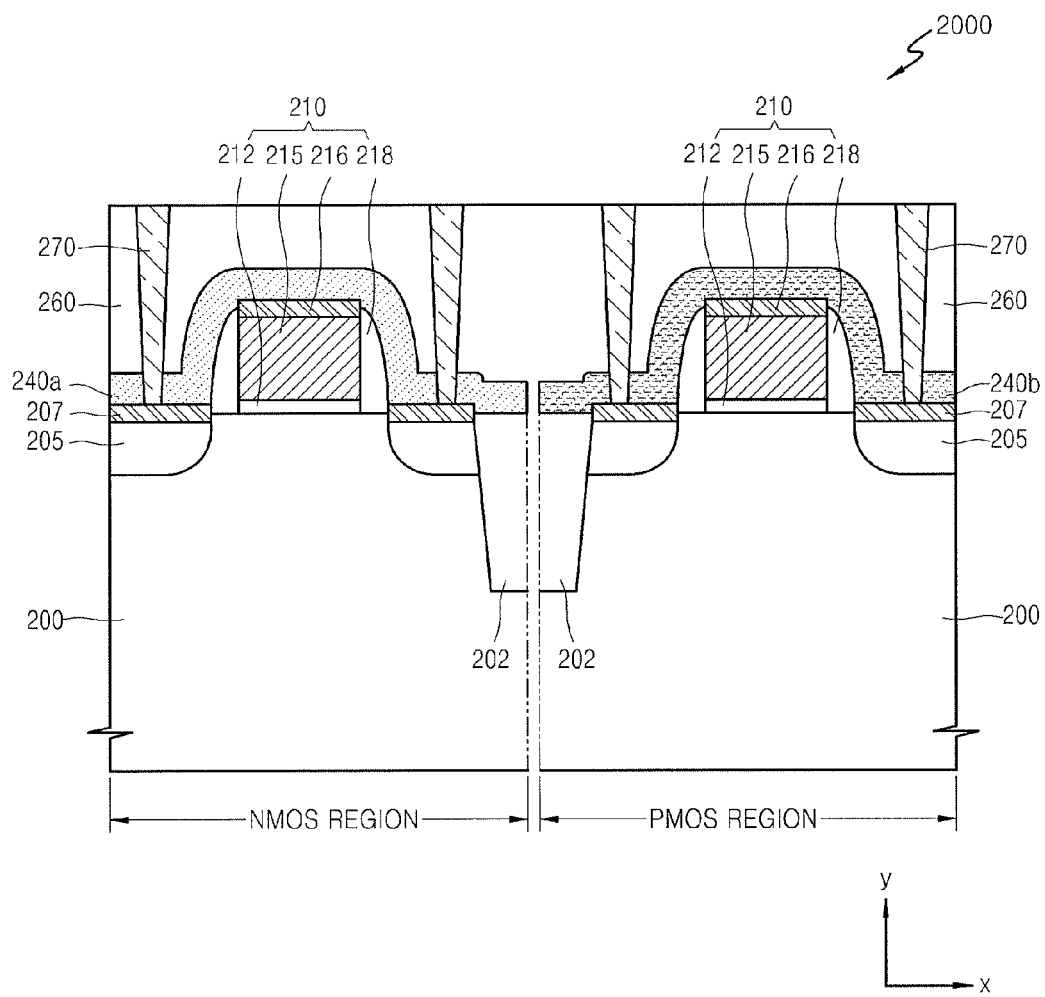
FIG. 6 illustrates a cross-sectional view of a semiconductor device according to an exemplary embodiment.

FIG. 6 illustrates a cross-sectional view of a semiconductor device 2000 according to another exemplary embodiment. The exemplary embodiment may be similar to the above exemplary embodiments, and differences between the above exemplary embodiments and the following exemplary embodiment will be mainly discussed.

Referring to FIG. 6, the semiconductor device 2000 may include a NMOS region in which an n-channel MOSFET is formed, and a PMOS region in which a p-channel MOSFET is formed. A substrate 200 may include device isolation layers 202, and active regions defined by the device isolation layers 202. The semiconductor device 2000 may include a gate structure 210, a second stress layer 240a or a fourth stress layer 240b, and contact plugs 270 formed on source/drain regions 205 formed at two sides of the gate structure 210, which are formed in each of the NMOS region and the PMOS region of the substrate 200. The semiconductor device 2000 may constitute a logic device or a circuit unit of a memory device.

The substrate 200 may be, e.g., a silicon monocrystalline substrate or an epitaxial layer. The substrate 200 may include a well region (not shown) formed by implanting impurities.

The device isolation layer 202 may have a shallow trench isolation (STI) structure, that is, a trench structure formed in the substrate 200. The device isolation layer 202 may include at least one oxide selected from Tonen SilaZene (TOSZ), a high temperature oxide (HTO), a high density plasma (HDP) material, a tetra ethyl ortho silicate (TEOS), a boron-phosphorus silicate glass (BPSG), and an undoped silicate glass (USG).

The substrate 200 may include the source/drain regions 205 formed at opposing sides of the gate structure 210. The source/drain regions 205 may be formed in both the NMOS region and the PMOS region. The source/drain regions 205 may be formed in the active region to a predetermined depth, and may be an impurity region including impurities. In the NMOS region, the impurities may be n-type impurities, e.g., phosphorus (P), arsenic (As), or antimony (Sb). In the PMOS region, the impurities may be p-type impurities, for example, boron (B), aluminum (Al), or gallium (Ga). A metal silicide region 207 may be formed on the source/drain regions 205.

The gate structure 210 may include a gate insulating layer 212, a gate electrode 215, a gate silicide layer 216, and a spacer 218. Gate structures 210 may be formed in both the NMOS region and the PMOS region. The gate insulating layer 212 may include, e.g., a silicon oxide. The gate electrode 215 may include, e.g., polysilicon. A metal silicide layer 216 may be formed on the gate electrode 215, e.g., on an uppermost surface of the gate electrode 215. The spacer 218 may be disposed on lateral sides of the gate insulating layer 212 and lateral sides of the gate electrode 215. The spacer 218 may include, e.g., a silicon nitride, a silicon oxide, or a multi-layer including a silicon nitride and/or a silicon oxide.

The second stress layer 240a or the fourth stress layer 240b may be formed to cover an upper portion of the gate structure 210 and upper portions of the metal silicide region 207 of the source/drain regions 205 in each of the NMOS region and the PMOS region. The second stress layer 240a and/or the fourth stress layer 240b may include, e.g., a silicon nitride. The second stress layer 240a and/or the fourth stress layer 240b may have a thickness in the range of about 200 Å to about 700 Å.

The second stress layer 240a and the fourth stress layer 240b may each be formed so as to exert a stress on channel regions in the substrate 200 between adjacent source/drain regions 205. Due to the stress, an energy band structure of the channel region may be changed to increase charge mobility.

The second stress layer 240a and the fourth stress layer 240b may exert different types of stresses on the NMOS region and the PMOS region, respectively. For example, the second stress layer 240a and the fourth stress layer 240b may exert a tensile stress and a compressive stress on the NMOS region and the PMOS region, respectively.

The contact plugs 270 may be formed on the source/drain regions 205. The contact plugs 270 may be disposed to apply voltages to the source/drain regions 205 to operate the semiconductor device 2000.

In the semiconductor device 2000, the second stress layer 240a and/or the fourth stress layer 240b may exert a stress on the channel region so as to increase charge mobility of the semiconductor device 2000, thereby increasing a drain current of the semiconductor device 2000.

FIGS. 7A through 7K illustrate cross-sectional views depicting stages in a method of manufacturing the semiconductor device 2000 of FIG. 6, according to another exemplary embodiment.

Figure 7A:
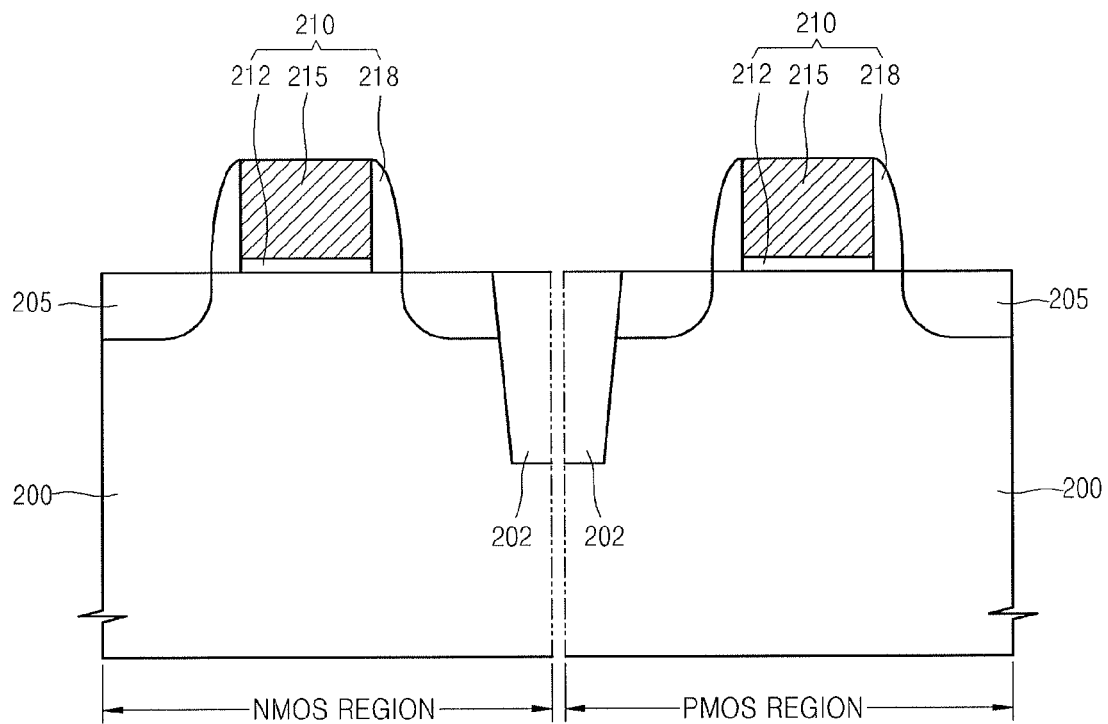
FIGS. 7A through 7K illustrate cross-sectional views depicting stages in a method of manufacturing the semiconductor device of FIG. 6, according to an exemplary embodiment.

Referring to FIG. 7A, the device isolation layer 202 may be formed in the substrate 200. A well region (not shown) may be formed in the substrate 200 illustrated in FIGS. 7A through 7K. For example, a p-type well may be formed by implanting p-type impurities into the NMOS region of the substrate 200, and an n-type well may be formed by implanting n-type impurities into the PMOS region of the substrate 200.

The device isolation layer 202 may be formed by forming a device isolation trench by using an etch process and then depositing an insulating material. After the insulating material is deposited, the device isolation layer 202 may be formed by performing a planarization process, e.g., chemical mechanical polishing (CMP).

Then, the gate structure 210 may be formed on the substrate 200. The gate structure 210 may be formed by sequentially depositing a material for forming the gate insulating layer 212 and a material for forming the gate electrode 215 and patterning the materials. The gate insulating layer 212 may include a silicon oxide ($SiO_2$), a high-k dielectric material, or a composite layer including a silicon oxide ($SiO_2$) and a silicon nitride (SiN). The gate electrode 215 may include polysilicon, or a metal such as tungsten (W).

Then, the spacer 218 may be formed on lateral sides of the gate insulating layer 212 and lateral sides of the gate electrode 215. The spacer 218 may include an insulating material, e.g., a silicon-based insulating material. In addition, the spacer 218 may include multi-layers including a silicon oxide or a silicon nitride. The source/drain regions 205 may be formed by implanting impurities into the substrate 200 by using the gate structure 210 as a mask.

Figure 7B:
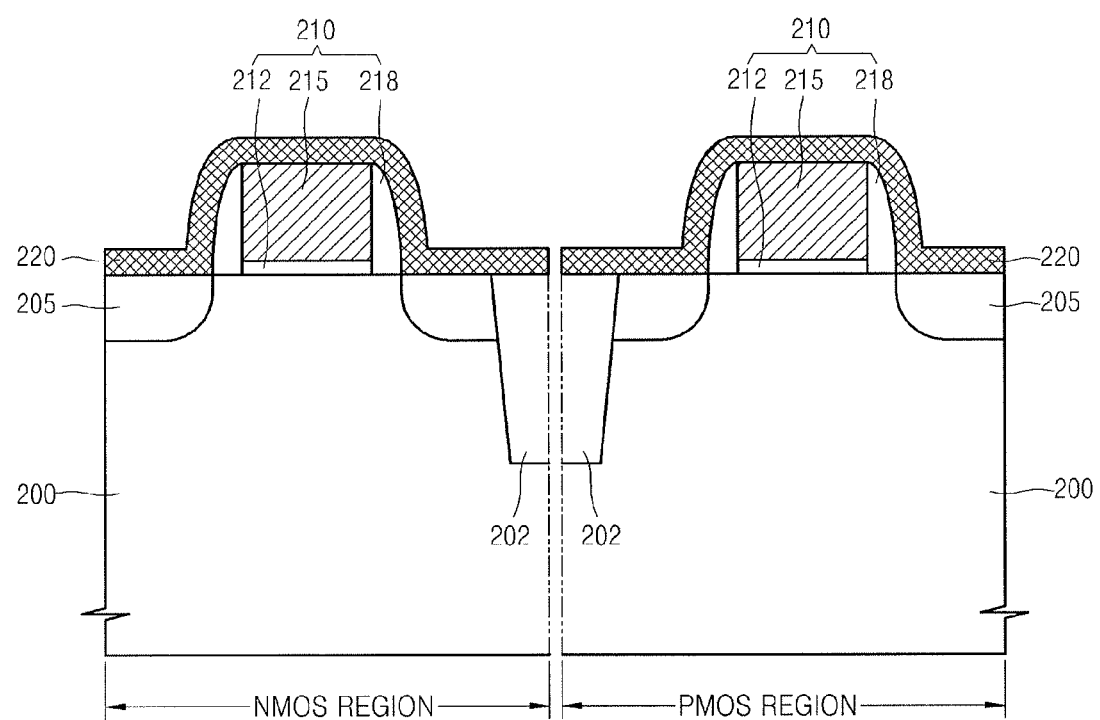

Referring to FIG. 7B, a metal layer 220 may be formed on the gate structure 210 and the source/drain regions 205. The metal layer 220 may include any one of titanium (Ti), cobalt (Co), platinum (Pt), and nickel (Ni). The metal layer 220 may have a thickness, e.g., in the range of about 100 Å to about 400 Å.

Figure 7C:
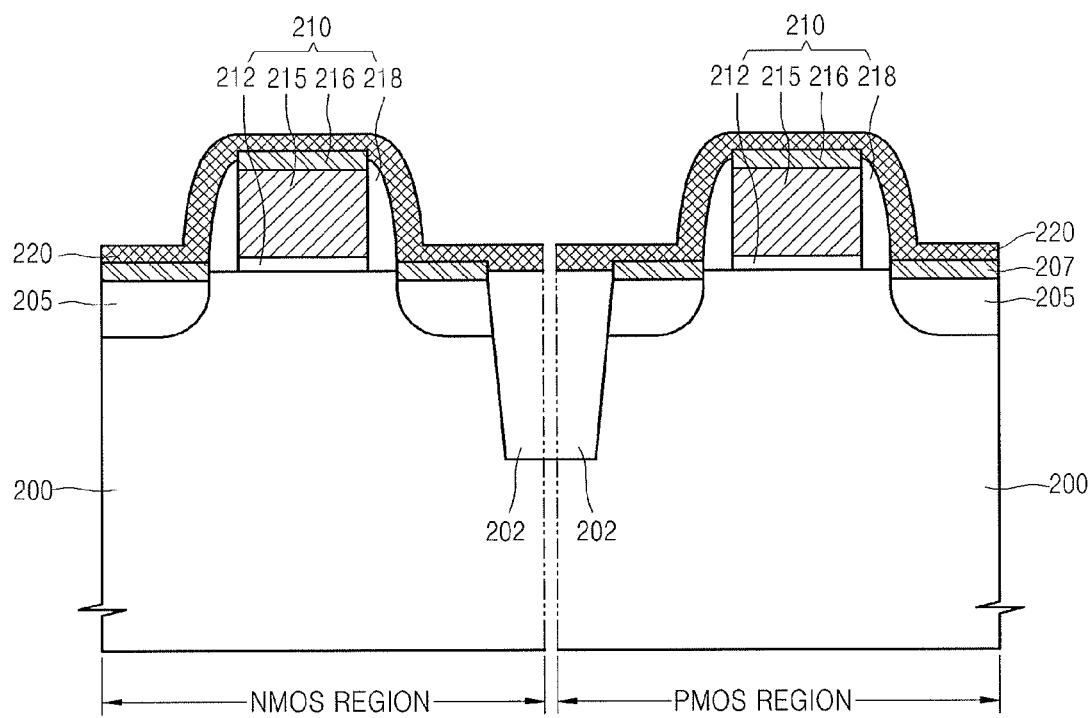

Referring to FIG. 7C, the metal silicide layer 216 and the metal silicide region 207 may be formed on the gate electrode 215 and the source/drain regions 205, respectively, to each have a thickness in the range of about 100 Å to about 300 Å by performing heat-treatment. As a result, the metal silicide layer 216 may be formed in a portion of the gate electrode 215, but is separately referred to from the gate electrode 215. Both the metal silicide layer 216 and the gate electrode 215 may be included in the gate structure 210. The metal silicide layer 216 and the metal silicide region 207 may each include a silicon compound, and at least one metal selected from titanium (Ti), cobalt (Co), nickel (Ni), platinum (Pt), and tantalum (Ta).

According to a modified exemplary embodiment, to reduce the possibility of and/or prevent the gate silicide layer 216 from being formed having different thicknesses in the NMOS region and the PMOS region, a dual silicide process of forming silicide by respectively using separate processes for the NMOS region and the PMOS region may be used. Alternatively, a same process may be used for silicide in both the NMOS region and the PMOS region.

Figure 7D:
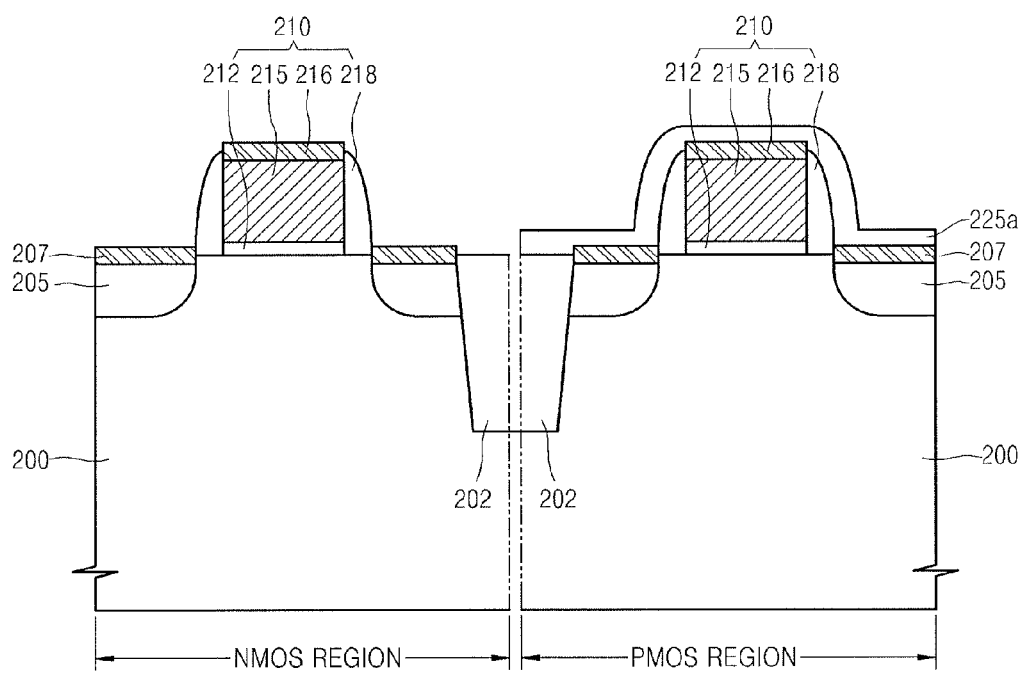

Referring to FIG. 7D, non-reacted portions of the metal layer 220, e.g., a portion of the metal layer 220 that is formed on the spacer 218 and a portion of the metal layer 220 that is formed on the device isolation layer 202, may be removed by using an etching process.

Then, a buffer layer 225a may be formed in the PMOS region so as to be used as an etch stop layer during removal of a first stress layer 230a to be described below with reference to FIG. 7F. The buffer layer 225a may be excluded in the NMOS region. The buffer layer 225a may reduce the possibility of and/or prevent a stress from being exerted on the PMOS region during formation of the first stress layer 230a to be described below with reference to FIG. 7E.

Figure 7E:
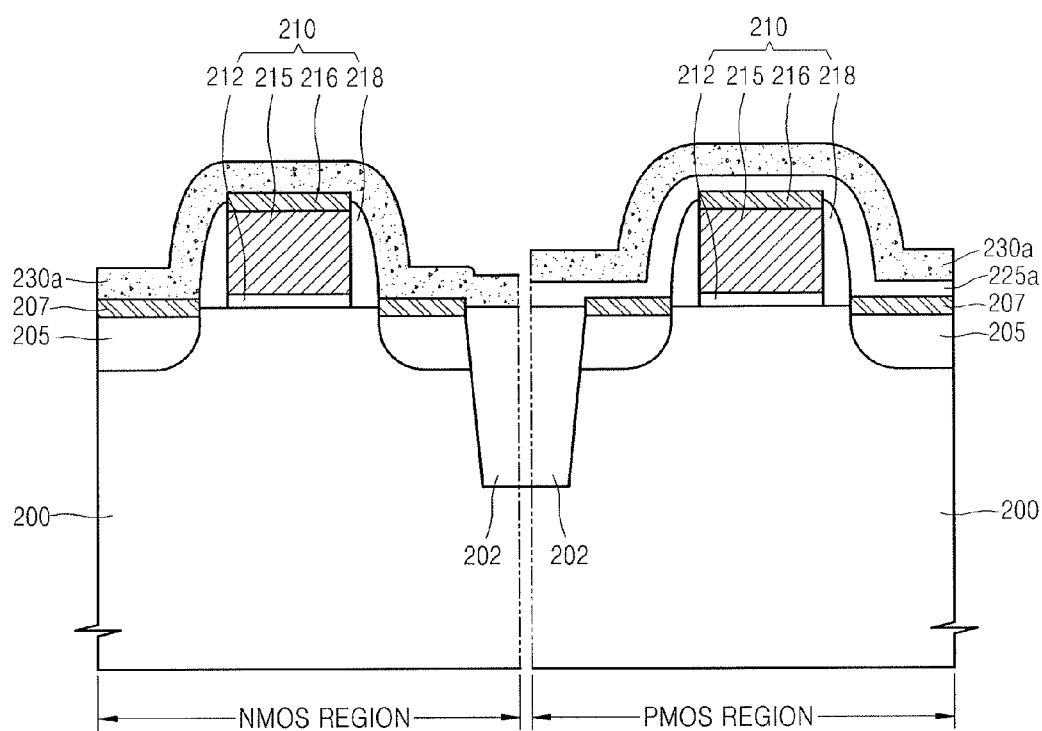

Referring to FIG. 7E, the first stress layer 230a may be formed on the substrate 200. The first stress layer 230a may be, e.g., a silicon nitride layer. According to an exemplary embodiment, in the NMOS region, the first stress layer 230a may be formed directly on the spacer 218, the gate silicide layer 216, and the metal silicide region 207. In the PMOS region, the first stress layer 230a may be formed directly on the buffer layer 225a. The first stress layer 230a may have a thickness in the range of about 200 Å to about 700 Å. The first stress layer 230a may be formed, e.g., by PECVD.

The first stress layer 230a may exert a stress on the channel region of the NMOS region. For example, in order to increase a tensile stress exerted on the channel region, after the first stress layer 230a that is a silicon nitride layer is formed, hydrogen may be removed from the silicon nitride layer by irradiating ultra violet (UV) rays. In this case, the sensitivity of the metal silicide layer 216 and the metal silicide region 207 with respect to agglomeration of silicide may be reduced, e.g., due to a reduction in an amount of hydrogen in the silicon nitride layer. Accordingly, the possibility of out-diffusion of impurities from the source/drain regions 205 may be reduced and/or prevented.

Due to the buffer layer 225a formed in the PMOS region, a stress from the first stress layer 230a may not be exerted on the channel region of the PMOS region even though the first stress layer 230a is formed in the PMOS region.

Figure 7F:
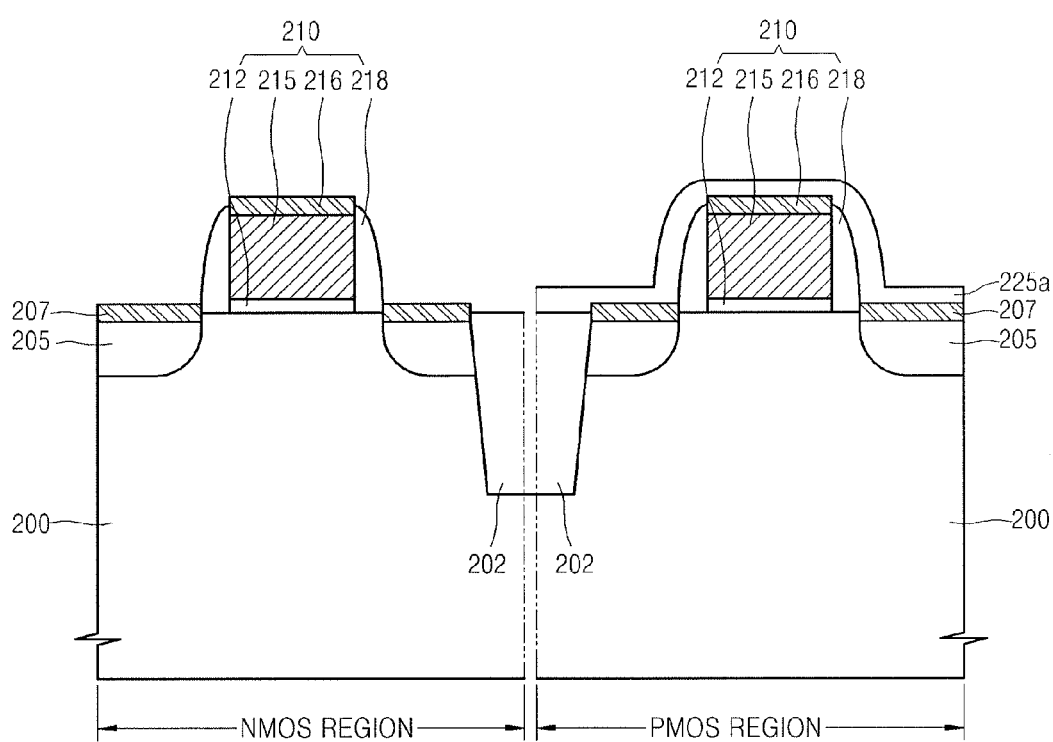

Referring to FIG. 7F, the first stress layer 230a may be removed. The first stress layer 230a may be removed by using, e.g., a wet etch process or a dry etch process. According to an exemplary embodiment, an entire portion of the first stress layer 230a may be removed. Alternatively, only a portion of the first stress layer 230a may be removed so that a thickness of the first stress layer 230a is reduced. The buffer layer 225a may be used as an etch stop layer when the first stress layer 230a is removed or when thickness of the first stress layer 230a is reduced. The buffer layer 225a may not be removed during the stage of removing the first stress layer 230a.

Even after the entire portion of the first stress layer 230a is removed, a stress exerted by the first stress layer 230a may remain in the channel region of the NMOS region. According to an exemplary embodiment, after the first stress layer 230a is formed, the effect of the stress may remain in the channel region, e.g., without a heat-treatment process and a recrystallization process.

Figure 7G:
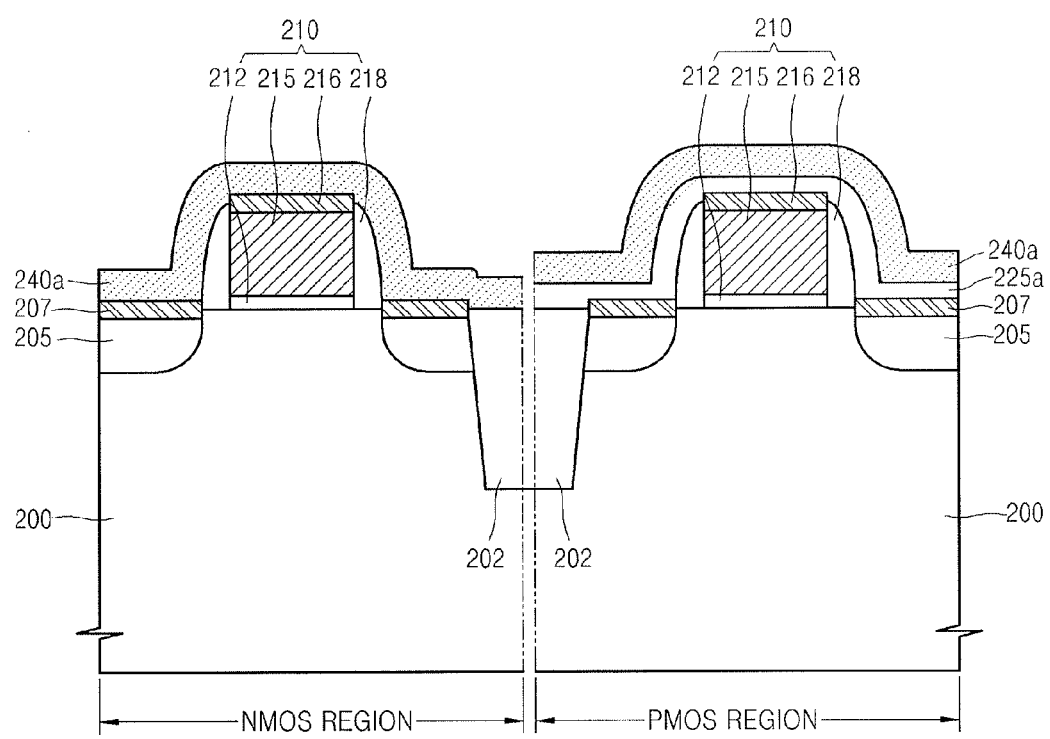

Referring to FIG. 7G, the second stress layer 240a may be formed on the substrate 200. The second stress layer 240a may be a silicon nitride layer, and may be formed by CVD, like the first stress layer 230a. The second stress layer 240a may have the same type and the same thickness as the first stress layer 230a of FIG. 7E.

A stress may be sequentially exerted at least twice on the channel region of the NMOS region by the first stress layer 230a and the second stress layer 240a. Thus, a high stress may be exerted on the channel region, compared to a case where a single process for forming a stress layer is performed. For example, when a stress of about 1 GPa is exerted by each of the first stress layer 230a and the second stress layer 240a, a stress equal to or greater than about 1.5 GPa may be exerted on the channel region. The metal silicide region 207 formed below the first stress layer 230a and the second stress layer 240a may be protected and/or prevented from being agglomerated, e.g., due to a stress, as compared to a case where a high stress is collectively exerted. According to another exemplary embodiment, a plurality of stages of forming the first stress layers 230a may be performed and a plurality of stages of removing the first stress layers 230a may be performed prior to forming the second stress layer 240a.

Then, the second stress layer 240a and the buffer layer 225a, which remain in the PMOS region, may be removed by forming a mask layer that is not shown in FIGS. 7A through 7K. During this stage, the second stress layer 240a may remain in the NMOS region. Further, the second stress layer 240a may remain in the NMOS region in a final semiconductor device.

Figure 7H:
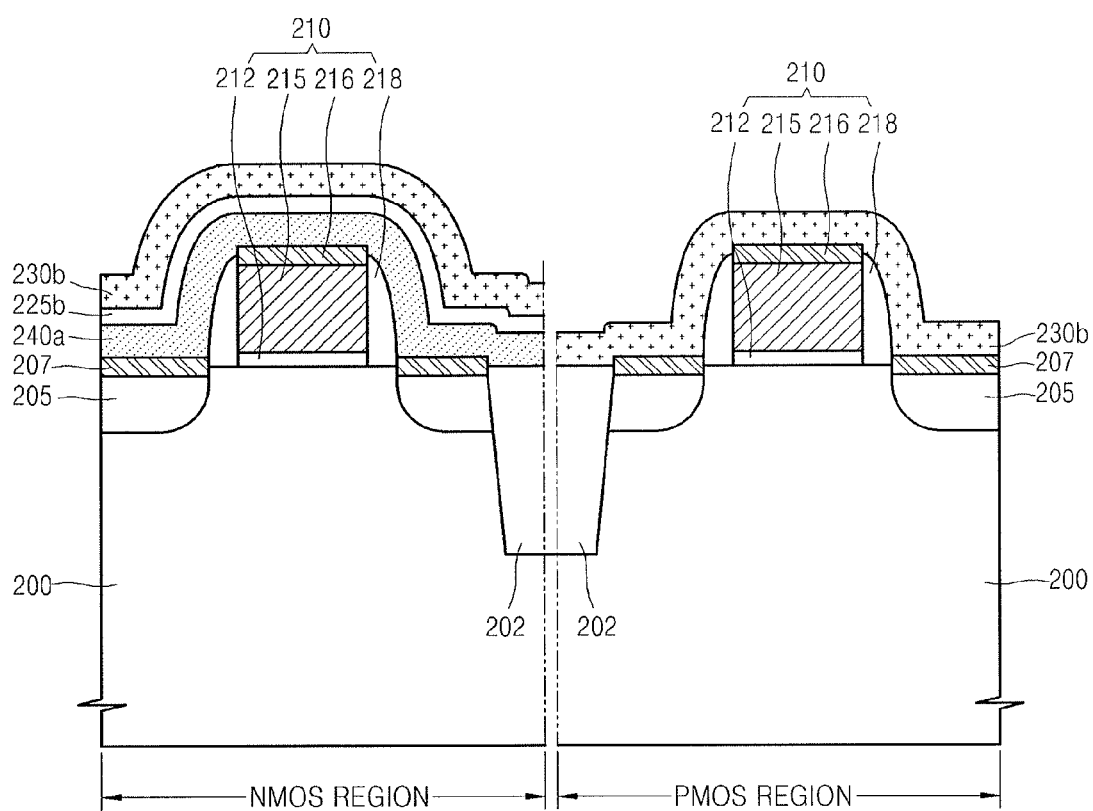

Referring to FIG. 7H, a buffer layer 225b may be formed on the second stress layer 240a of the NMOS region. The buffer layer 225b may be excluded in the PMOS region. The buffer layer 225b may be selectively formed, and thus, may be omitted if necessary in the NMOS region and/or the PMOS region. The buffer layer 225b may be formed so as to be used as an etch stop layer during removal of a third stress layer 230b to be described below with reference to FIG. 7I.

Then, the third stress layer 230b may be formed on the substrate 200, e.g., in both the NMOS region and the PMOS region. According to an exemplary embodiment, in the NMOS region the third stress layer 230b may be formed directly on the buffer layer 225b. In the PMOS region the third stress layer 230b may be formed directly on the spacer 218, the gate silicide layer 216, and the metal silicide region 207. The third stress layer 230b may be, e.g., a silicon nitride layer. The third stress layer 230b may have a thickness of about 200 Å to about 700 Å. The third stress layer 230b may be formed, e.g., by PECVD.

The third stress layer 230b may exert a stress on the channel region of the PMOS region. For example, in order to increase a compressive stress on the channel region, when the third stress layer 230b that is a silicon nitride layer is formed, ion bombardment may be performed by using argon (Ar) gases and hydrogen (H$_2$) gases. Due to the buffer layer 225b formed in the NMOS region, a stress from the third stress layer 230b may not be exerted on the channel region of the NMOS region.

Figure 7I:
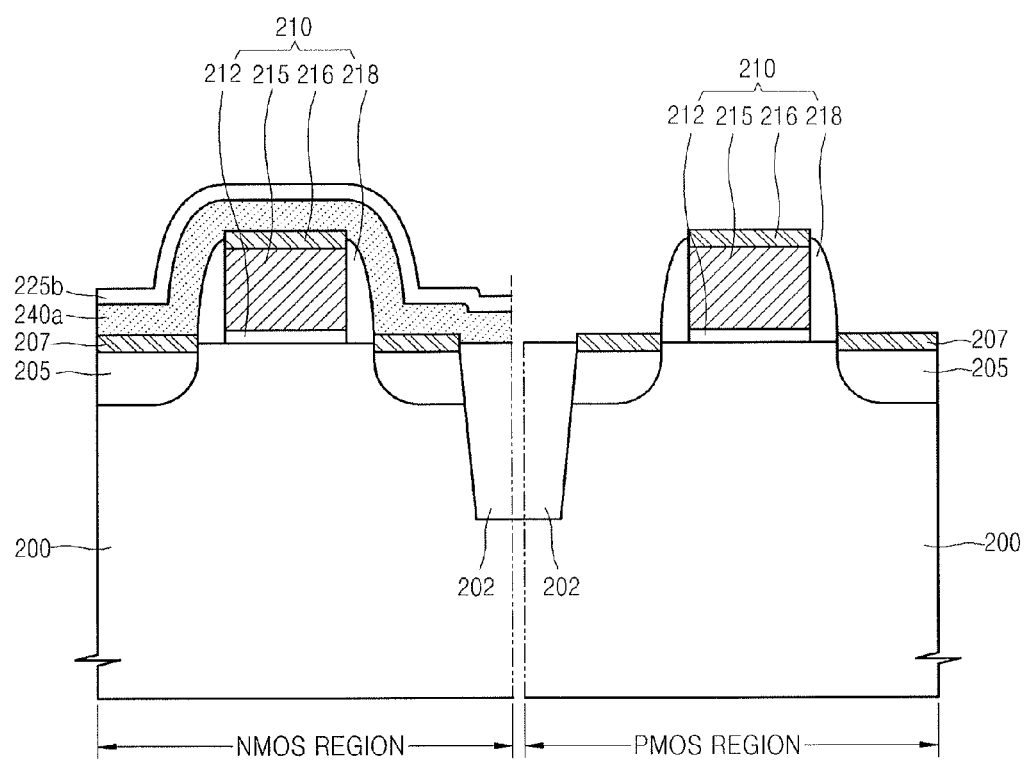

Referring to FIG. 7I, the third stress layer 230b may be removed. The third stress layer 230b may be removed by using, e.g., a wet etch process or a dry etch process. According to an exemplary embodiment, an entire portion of the third stress layer 230b may be removed. Alternatively, only a portion of the third stress layer 230b may be removed so that a thickness of the third stress layer 230b is reduced. After the stage of removing the third stress layer 230b or reducing the thickness of the third stress layer 230b, the buffer layer 225b may remain in the NMOS region.

Even after the third stress layer 230b is removed, the effect of the stress exerted by the third stress layer 230b may remain in the channel region of the NMOS region.

Figure 7J:
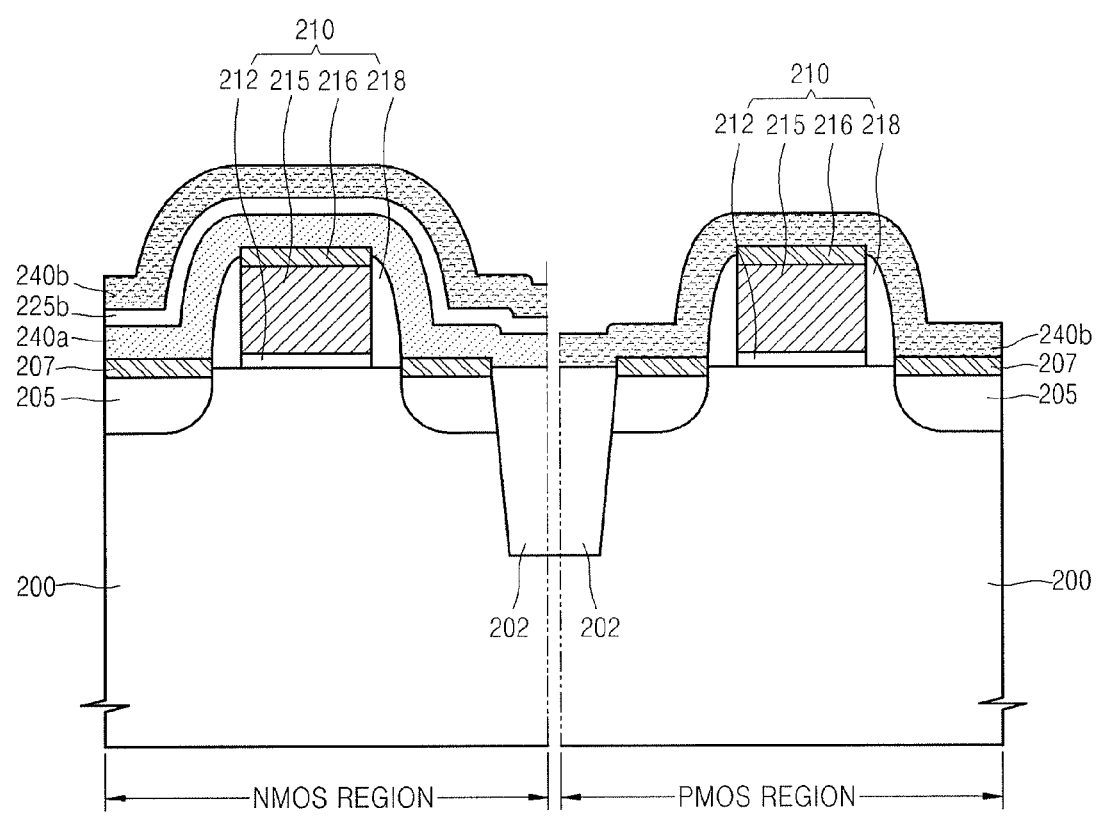

Referring to FIG. 7J, the fourth stress layer 240b may be formed on the substrate 200. The fourth stress layer 240b may be, e.g., a silicon nitride layer. The fourth stress layer 240b may be formed by CVD. The fourth stress layer 240b may be similar to the third stress layer 230b.

A stress may be sequentially exerted at least twice on the channel region of the PMOS region by the third stress layer 230b and the fourth stress layer 240b. Thus, a high stress may be exerted on the channel region, compared to a case where a single process for forming a stress layer is performed. According to another exemplary embodiment, a plurality of stages of forming the third stress layer 230b and a plurality of stages of removing the third stress layer 230b may be performed prior to forming the fourth stress layer 240b.

Figure 7K:
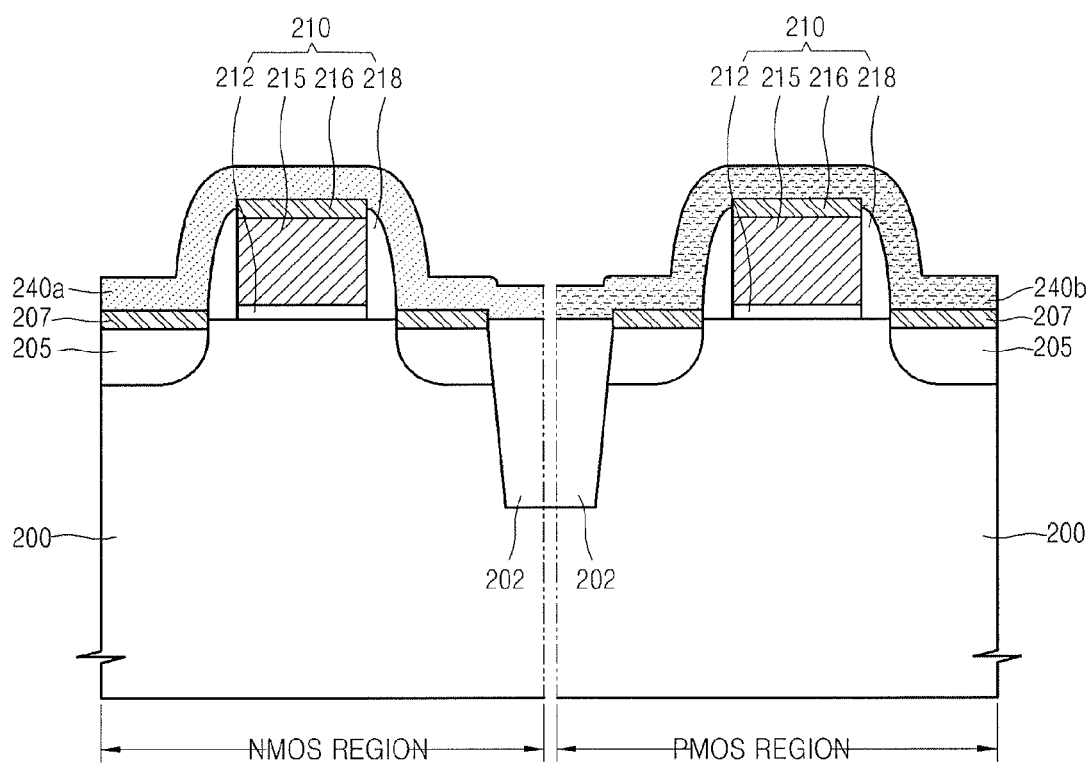

Referring to FIG. 7K, the fourth stress layer 240b and the buffer layer 225a that remain in the PMOS region may be removed by forming a mask layer that is not shown in FIGS. 7A through 7K. Thus, the semiconductor device 2000 may have a structure in which the second stress layer 240a is formed in the NMOS region and the fourth stress layer 240b is formed in the PMOS region.

Then, referring to FIGS. 6 and 7K, an interlayer insulating layer 260 may be formed on the substrate 200. The interlayer insulating layer 260 may include, e.g., a silicon oxide.

Then, contact holes (not shown) may be formed by partially etching the interlayer insulating layer 260 on the source/drain regions 205. The etching may be anisotropic etching, and the second stress layer 240a and the fourth stress layer 240b may serve as etch stop layers in the NMOS region and the PMOS region, respectively.

The contact plugs 270 may be formed by forming a conductive material in the contact holes (not shown), thereby forming the semiconductor device 2000 of FIG. 6.

Figure 8A:
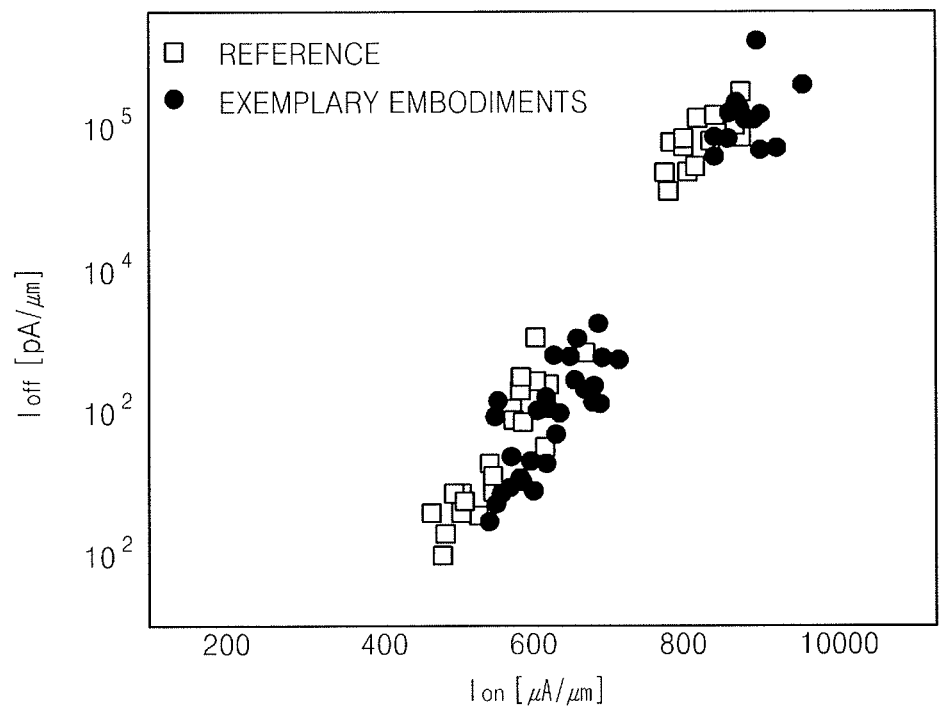
FIGS. 8A and 8B illustrate graphs showing the characteristics of a semiconductor device, according to an exemplary embodiment.
Figure 8B:
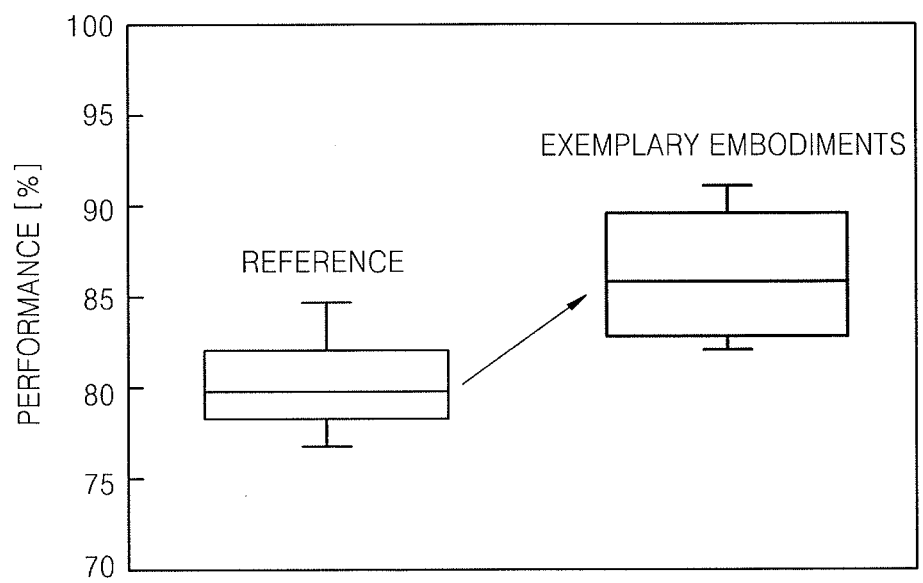

FIGS. 8A and 8B are graphs showing the characteristics of a semiconductor device, according to an exemplary embodiment.

FIG. 8A shows a relationship between an on-current $I_{on}$ and an off-current $I_{off}$ of a drain of the semiconductor device according to an exemplary embodiment. The term 'reference' in FIG. 8A refers to a current value of a semiconductor device on which a stress is exerted by a high stress layer that is formed once.

Referring to FIG. 8A, when a stress layer having a stress of about 1.1 GPa with respect to a NMOS semiconductor device is formed twice, current values were measured. As measured, when a stress layer is formed twice, increased on-current $I_{on}$ characteristics may be obtained, compared to a similar off-current ($I_{off}$).

FIG. 8B shows numbers obtained by comparing current characteristics of the exemplary embodiments of FIG. 8A. Compared to a case where a stress layer is formed once, performance, in particular, the drain current characteristics of a semiconductor device, may be increased by about 6% when the stress layer is formed at least twice. This is because a total stress exerted on a channel region of the semiconductor device is increased. In addition, since a stress is divided and exerted twice, silicide layers formed below the stress layer may not be damaged, thereby improving the characteristics of the semiconductor device.

By way of summation and review, there is a need for a method of manufacturing a semiconductor device that improves the characteristics thereof by, e.g., lowering resistances of a gate electrode and source/drain regions and increasing charge mobility of a channel region. Technologies for exerting a stress, e.g., a tensile or compressive stress, on a channel region of a transistor by using a contact etch stop layer (CESL) process have been developed. In this case, as the stress is increased, the performance of the transistor may be remarkably improved. For example, a tensile stress may increase charge mobility and a compressive stress may increase hole mobility. However, there is a limit in increasing the stress exerted by the CESL. For example, when a high-stress layer is used in order to exert a high stress, a silicide layer formed below the high-stress layer may be damaged such as by becoming deformed and/or agglomerated.

In contrast, the exemplary embodiment discussed above relate to providing a process for exerting a high stress on a channel region while protecting an underlying layer. For example, a contact etch stop layer (CESL) may be removed and then may be reformed. That is, forming of one CESL, removing of the one CESL, and forming another CESL may be repeated a plurality of times. The CESL may be, e.g., a silicon nitride. The removal of the CESL may be performed by using a wet etch process or a dry etch process.

Accordingly, embodiments relate to a method of manufacturing a semiconductor device for obtaining a high integration density and improved reliability. For example, a resultant NMOS semiconductor device may have improved current characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
providing a substrate having a gate structure, a source region, and a drain region formed thereon, the gate structure including a gate insulating layer and a gate electrode;
forming a first stress layer on the substrate to cover the gate structure, the source region, and the drain region;
removing the first stress layer; and
forming a second stress layer on the substrate,
wherein removing the first stress layer includes removing substantially an entirety of the first stress layer such that the second stress layer covers the gate structure, the source region, and the drain region.

2. The method as claimed in claim 1, wherein both the first stress layer and the second stress layer provide a same type of stress from among a compressive stress and a tensile stress such that the first and second stress layers exert the same type of stress on a channel region, the channel region being between the source region and the drain region of the substrate.

3. The method as claimed in claim 1, wherein, prior to forming the second stress layer, forming of the first stress layer and removing of the first stress layer are performed a plurality of times.

4. The method as claimed in claim 1, further comprising, prior to forming the first stress layer and prior to forming the second stress layer, forming a buffer layer including a material having etch selectivity with respect to each of the first stress layer and the second stress layer.

5. The method as claimed in claim 1, wherein the first stress layer and the second stress layer both include a silicon nitride.

6. The method as claimed in claim 5, wherein forming the first stress layer and forming the second stress layer both include:
depositing the silicon nitride, and
irradiating ultra violet rays to the silicon nitride.

7. The method as claimed in claim 5, wherein depositing the silicon nitride for forming the first stress layer and depositing the silicon nitride for forming the second stress layer include performing ion bombardment on the silicon nitride.

8. The method as claimed in claim 1, wherein:
the gate insulating layer includes a material with a high dielectric constant, and
the gate electrode includes a metal.

9. The method as claimed in claim 1, further comprising, prior to forming the first stress layer, forming a metal silicide layer on the gate electrode, the source region, and the drain region.

10. The method as claimed in claim 9, wherein forming the metal silicide layer includes:
forming a metal layer on the gate structure, the source region, and the drain region,
heat-treating the metal layer to selectively form the metal silicide layer on the gate structure, the source region, and the drain region, and
removing non-reacted portions of the metal layer, the non-reacted portions of the metal layer corresponding to portions of the metal layer excluded from the metal silicide layer.

11. The method as claimed in claim 1, further comprising:
forming an interlayer insulating layer on the substrate; and
forming contact plugs on the source region and the drain region by using the second stress layer as an etch stop layer.

12. The method as claimed in claim 1, wherein, when a stress exerted on a channel region between the source region and the drain region is a tensile stress, the tensile stress is equal to or greater than about 1.5 GPa.

13. A method of manufacturing a semiconductor device, the method comprising:
providing a substrate having a gate electrode, a source region, and a drain region formed thereon;
forming an etch stop layer for forming contact plugs that are connected to the source region and the drain region, respectively, on the substrate, the etch stop layer covering the gate structure, the source region, and the drain region;
removing the etch stop layer; and
forming an additional etch stop layer on the substrate,
wherein removing the etch stop layer includes removing substantially an entirety of the etch stop layer such that the additional etch stop layer covers the gate structure, the source region, and the drain region.

14. The method as claimed in claim 13, wherein the etch stop layer and the additional etch stop layer contain a stress therein.

15. A method of manufacturing a semiconductor device, the method comprising:
providing a substrate having a gate structure, a source region, and a drain region formed thereon, the gate structure including a gate insulating layer and a gate electrode;
forming a first stress layer on the substrate to cover the gate structure, the source region, and the drain region;
removing the first stress layer;
forming a second stress layer on the substrate after removing the first stress layer;
forming an interlayer insulating layer on the second stress layer; and
forming contact holes in the interlayer insulating layer by using the second stress layer as an etch stop layer,
wherein removing the first stress layer includes removing substantially an entirety of the first stress layer such that the second stress layer covers the gate structure, the source region, and the drain region.

16. The method as claimed in claim 15, wherein:
the substrate includes a channel region between the source region and the drain region, and
the first stress layer and the second stress layer apply a same type of stress to the channel region.

17. The method as claimed in claim 15, further comprising forming a third stress layer and a fourth stress layer before forming the interlayer insulating layer, wherein:
the gate structure, the source region, and the drain region are one of a plurality of gate structures, a plurality of source regions, and a plurality of drain regions, respectively,
the substrate includes a NMOS region and a PMOS region each having formed therein at least one of the plurality of gate structures, at least one of the plurality of source regions, and at least one of the plurality of drain regions,
the first stress layer and the second stress layer apply a first type of stress to one channel region in one of the NMOS region and the PMOS region, and
the third stress layer and the fourth stress layer apply a second type of stress to another channel region in another of the NMOS region and the PMOS region, the second type of stress being different from the first type of stress.

18. A method of manufacturing a semiconductor device, the method comprising:
providing a substrate having a gate structure, a source region, and a drain region formed thereon, the gate structure including a gate insulating layer and a gate electrode;
forming a first stress layer on the substrate;
removing an upper thickness portion of the first stress layer such that a remaining thickness portion of first stress layer on the substrate has a predetermined thickness; and
forming a second stress layer substantially covering an entirety of the first stress layer.

* * * * *